(12) United States Patent
Kim et al.

(10) Patent No.: US 10,591,753 B2
(45) Date of Patent: Mar. 17, 2020

(54) ELECTROLUMINESCENT DISPLAY

(71) Applicant: LG Display Co., Ltd., Seoul (KR)

(72) Inventors: Jiyun Kim, Paju-si (KR); Choelmin Woo, Paju-si (KR); Woochan Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/048,811

(22) Filed: Jul. 30, 2018

(65) Prior Publication Data

US 2019/0064552 A1  Feb. 28, 2019

(30) Foreign Application Priority Data

Aug. 31, 2017 (KR) .................. 10-2017-0111474

(51) Int. Cl.
*G02F 1/01* (2006.01)
*H01L 27/32* (2006.01)

(52) U.S. Cl.
CPC .......... *G02F 1/0107* (2013.01); *H01L 27/326* (2013.01); *H01L 27/3246* (2013.01); *H01L 27/3276* (2013.01); *H01L 27/3279* (2013.01)

(58) Field of Classification Search
CPC  H01L 27/326; H01L 27/3276; H01L 27/3246
See application file for complete search history.

(56) References Cited

U.S. PATENT DOCUMENTS

| | | | | |
|---|---|---|---|---|
| 2007/0241672 A1* | 10/2007 | Sakamoto | ........... | H01L 27/3276 313/505 |
| 2012/0187399 A1* | 7/2012 | Fukuda | ............ | H01L 29/78603 257/43 |
| 2015/0379924 A1* | 12/2015 | Matsueda | ........... | G09G 3/3208 345/690 |

* cited by examiner

*Primary Examiner* — Jay C Chang
*Assistant Examiner* — Mikka Liu
(74) *Attorney, Agent, or Firm* — Fenwick & West LLP

(57) ABSTRACT

An electroluminescent display is disclosed. The electroluminescent display includes a display panel including sub-pixels in which a light emitting area is defined and wirings connected to the sub-pixels. The sub-pixels have a transistor and a light emitting element. The wirings include a first wiring arranged along a first axis direction or a second axis direction perpendicular to the first axis direction. The first wiring is disposed under a first electrode of the light emitting element with an organic insulating layer interposed therebetween, and includes an overlapping portion overlapping with the light emitting area when viewed from plan. The overlapping portion of the first wiring has a shape with symmetry with respect to a center of gravity of the light emitting area.

16 Claims, 25 Drawing Sheets

Viewing angle balance

ELECTROLUMINESCENT DISPLAY

CROSS-REFERENCE TO RELATED APPLICATIONS

This application claims the priority to Republic of Korea Patent Application No. 10-2017-0111474 filed on Aug. 31, 2017 with the Korean Intellectual Property office, which is incorporated herein by reference in its entirety.

BACKGROUND

Field of Technology

The present disclosure relates to an electroluminescent display.

Discussion of the Related Art

Various display devices capable of reducing weight and volume, which are disadvantages of cathode ray tubes, have been developed. The display devices may be implemented as a liquid crystal display (LCD), a field emission display (FED), a plasma display panel (PDP), an electroluminescent display, and the like.

Among these display devices, the electroluminescent display is classified into an inorganic light emitting display device and an organic light emitting display device depending on a material of the light emitting layer. The organic light emitting display device is a self-emission type display device which excites an organic compound to emit light. The organic light emitting display has advantages of being light and thin and simplifying the process because the backlight used in the LCD is not required. In addition, the organic light emitting display device is widely used because it has characteristics such as low-temperature production, high response speed as response speed of less than 1 ms, low power consumption, wide viewing angle and high contrast.

FIG. 1 is a view for explaining problems of a conventional electroluminescent display.

Referring to FIG. 1, an organic light emitting display device includes a display panel having pixels and a plurality of lines LN for driving the pixels. Each of the pixels includes a thin film transistor and an organic light emitting diode OLE connected to the thin film transistor.

The organic light emitting diode OLE for converting electrical energy into light energy includes an anode E1, a cathode E2, and an organic light emitting layer OL disposed therebetween. In the organic light emitting display device, holes and electrons injected from the anode E1 and the cathode E2, respectively, are combined in the organic light emitting layer OL to form excitons. The formed excitons emit light while falling from an excited state to a ground state and display an image.

In general, various lines LN for driving the organic light emitting diode OLE are disposed under the organic light emitting diode OLE. An upper surface of a substrate on which the lines LN are formed is uneven due to the thickness of the lines LN and has a stepped portion. When the organic light emitting diode OLE is disposed directly on the upper surface of the substrate having the stepped portion, imbalance of a color viewing angle (or asymmetry) may occur because light generated from the organic light emitting layer OL is not uniformly dispersed. The imbalance of the color viewing angle gives a sense of heterogeneity (or sense of difference) depending on a position, so that a user can recognize the imbalance of the color viewing angle as a defect of display quality of the organic light emitting display device.

In order to prevent the defect, a planarization layer PLN is further disposed, which can planarize the upper surface of the substrate before forming the organic light emitting diode OLE. The planarization layer PLN includes an organic material. However, even if the planarization layer PLN is formed, the stepped portion formed by the lines LN is not completely removed, so that there is a limit in solving the above-described the imbalance of the color viewing angle. That is, as shown in FIG. 1, the upper surface of the planarization layer PLN is not planarized by the lines LN positioned close to the under portion of the planarization layer PLN, and may become uneven. Due to the bending of the upper surface, the organic light emitting diode OLE formed on the planarization layer PLN may be bent in a region where the lines LN are positioned. Therefore, the imbalance of the color viewing angle (or asymmetry) may occur because light generated in the organic light emitting layer OL of the organic light emitting diode OLE is not uniformly dispersed.

SUMMARY

The present disclosure provides an electroluminescent display in which imbalance of a color viewing angle is minimized.

In one aspect, there is provided an electroluminescent display including a display panel including sub-pixels in which a light emitting area is defined and wirings connected to the sub-pixels. The sub-pixels have a transistor and a light emitting element. The wirings include a first wiring arranged along a first axis direction or a second axis direction perpendicular to the first axis direction. The first wiring is disposed under a first electrode of the light emitting element with an organic insulating layer interposed therebetween, and includes an overlapping portion overlapping with the light emitting area when viewed from plan. The overlapping portion of the first wiring has symmetry with respect to a center of gravity of the light emitting area.

The overlapping portion of the first wiring may have a shape with line symmetry with respect to a first axis of symmetry or a second axis of symmetry. The first axis of symmetry is parallel with the first axis direction and passes through the center of gravity of the light emitting area. The second axis of symmetry is parallel with the second axis direction and passes through the center of gravity of the light emitting area.

The overlapping portion of the first wiring may have a shape with point symmetry with respect to a center of symmetry that is the center of gravity of the light emitting area.

The wirings may comprise a second wiring disposed under the first wiring with an inorganic insulating layer interposed therebetween, and arranged along the first axis direction or the second axis direction. The second wiring may include an overlapping portion overlapping with the light emitting area when viewed from plan. The overlapping portion of the second wiring may have a shape with line symmetry with respect to a first axis of symmetry, a shape with line symmetry with respect to a second axis of symmetry or a shape with point symmetry with respect to a center of symmetry. The first axis of symmetry is parallel with the first axis direction and passes through the center of gravity of the light emitting area. The second axis of symmetry is parallel with the second axis direction and passes through the center of gravity of the light emitting area. The center of symmetry is the center of gravity of the light emitting area.

The wirings may comprise a 2-1 wiring disposed under the first wiring with an inorganic insulating layer interposed therebetween, and arranged along the first axis direction, or the second axis direction and a 2-2 wiring disposed under the first wiring with an inorganic insulating layer interposed therebetween, and arranged in parallel with the 2-1 wiring. The 2-1 wiring and the 2-2 wiring may include an overlapping portion overlapping with the light emitting area when viewed from plan. The overlapping portion of the 2-1 wiring and the overlapping portion of the 2-2 wiring may have a shape with line symmetry with respect to an axis of symmetry or a shape with point symmetry with respect to a center of symmetry. The axis of symmetry is parallel with an extending direction of the 2-1 wiring and passes through the center of gravity of the light emitting area. The center of symmetry is the center of gravity of the light emitting area.

The display panel may comprise an organic insulating layer disposed under the first wiring.

The wirings may comprise a bypass wiring disposed in the same layer as the first wiring. The bypass wiring may not overlap with the light emitting area when viewed from plan.

The wirings may comprise a VDD wiring for supplying a high level power supply voltage to the sub-pixels, and a first auxiliary wiring disposed on the VDD wiring with an organic insulating layer interposed therebetween and extending in at least one of the first axis direction and the second axis direction. The first auxiliary wiring may be the first wiring.

In another aspect, there is provided an electroluminescent display including a display panel including sub-pixels in which a light emitting area is defined, and wirings connected to the sub-pixels. The sub-pixels have a transistor and a light emitting element. The wirings include a 1-1 wiring arranged along a first axis direction or a second axis direction perpendicular to the first axis direction, and a 1-2 wiring arranged in parallel with the 1-1 wiring. The 1-1 wiring and the 1-2 wiring are disposed under a first electrode of the light emitting element with an organic insulating layer interposed therebetween, and include an overlapping portion overlapping with the light emitting area when viewed from plan. The overlapping portion of the 1-1 wiring and the overlapping portion of the 1-2 wiring are symmetry with respect to a center of gravity of the light emitting area.

The overlapping portion of the 1-1 wiring and the overlapping portion of the 1-2 wiring may be line symmetry with respect to an axis of symmetry that is parallel with an extending direction of the 1-1 wiring and passes through the center of gravity of the light emitting area.

The overlapping portion of the 1-1 wiring and the overlapping portion of the 1-2 wiring may be point symmetry with respect to the center of gravity of the light emitting area as a center of symmetry.

The wirings may comprise a second wiring disposed under the 1-1 wiring with an inorganic insulating layer interposed therebetween, and arranged along the first axis direction or the second axis direction. The second wiring includes an overlapping portion overlapping with the light emitting area when viewed from plan. The overlapping portion of the second wiring is line symmetry with respect to a first axis of symmetry, line symmetry with respect to a second axis of symmetry or point symmetry with respect to a center of symmetry. The first axis symmetry is parallel with the first axis direction and passes through the center of gravity of the light emitting area. The second axis of symmetry is parallel with the second axis direction and passes through the center of gravity of the light emitting area. The center of symmetry is the center of gravity of the light emitting area.

The wirings may comprise a 2-1 wiring disposed under the 1-1 wiring and the 1-2 wiring with an inorganic insulating layer interposed therebetween, and arranged along the first axis direction or the second axis direction, and a 2-2 wiring disposed under the 1-1 wiring and the 1-2 wiring with an inorganic insulating layer interposed therebetween, and arranged in parallel with the 2-1 wiring. The 2-1 wiring and the 2-2 wiring include an overlapping portion overlapping with the light emitting area when viewed from plan. The overlapping portion of the 2-1 wiring and the overlapping portion of the 2-2 wiring are line symmetry with respect to an axis of symmetry that is parallel with an extending direction of the 2-1 wiring and passes through the center of gravity of the light emitting area, or point symmetry with respect to the center of gravity of the light emitting area as a center of symmetry.

The display panel may comprise an organic insulating layer disposed under the 1-1 wiring and the 1-2 wiring.

The wirings may comprise a bypass wiring disposed in the same layer as the 1-1 wiring and the 1-2 wiring. The bypass wiring does not overlap with the light emitting area when viewed from plan.

The wirings may comprise a VDD wiring for supplying a high level power supply voltage to the sub-pixels, and a first auxiliary wiring disposed on the VDD wiring with an organic insulating layer interposed therebetween and extending in at least one of the first axis direction and the second axis direction. The first auxiliary wiring is the 1-1 wiring and the 1-2 wiring.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
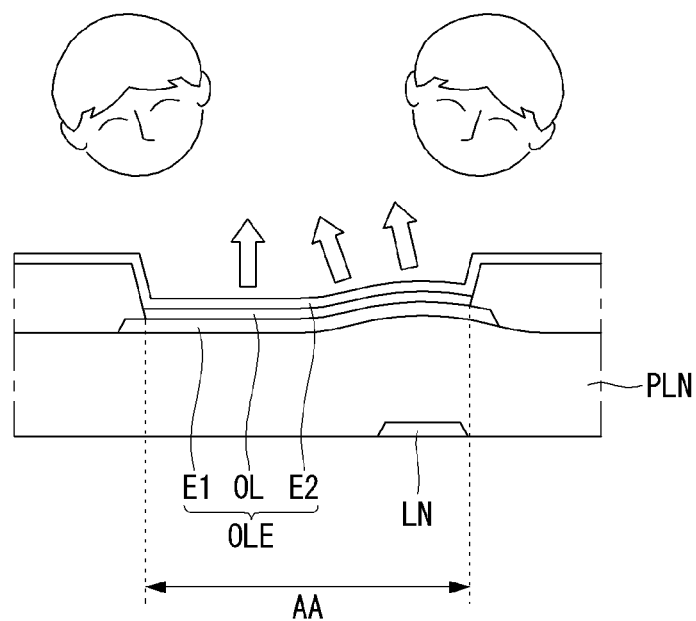
FIG. 1 is a view for explaining problems of a conventional electroluminescent display.

Advantages and features of the present disclosure and methods for accomplishing the same will become apparent with reference to embodiments described in detail below with reference to the accompanying drawings. However, the present disclosure is not limited to the embodiments disclosed below, and may be implemented in various forms. These embodiments are provided so that the present disclosure will be exhaustively and completely described, and will fully convey the scope of the present disclosure to those skilled in the art to which the present disclosure pertains. The present disclosure is defined by the scope of the claims.

Shapes, sizes, ratios, angles, number, and the like illustrated in the drawings for describing embodiments of the present disclosure are merely exemplary, and the present disclosure is not limited thereto. Like reference numerals designate like elements throughout the description. In the following description, when a detailed description of well-known functions or configurations related to this document is determined to unnecessarily cloud a gist of the disclosure, the detailed description thereof will be omitted.

In the present disclosure, when the terms "include", "have", "comprise", etc. are used, other components may be added unless "~ only" is used. A singular expression can include a plural expression as long as it does not have an apparently different meaning in context.

In the explanation of components, even if there is no separate description, it is interpreted as including an error range.

In the description of position relationship, when a structure is described as being positioned "on or above", "under or below", "next to" another structure, this description should be construed as including a case in which the structures contact each other as well as a case in which a third structure is disposed therebetween.

In the following description of the embodiment, the terms "first", "second", etc. may be used to describe various components, but the components are not limited by such terms. These terms are only used to distinguish one component from another component. Therefore, the first component mentioned below may be the second component within the technical spirit of the disclosure.

The features of various embodiments of the present disclosure can be partially combined or entirely combined with each other, and is technically capable of various interlocking and driving. The embodiments can be independently implemented, or can be implemented in conjunction with each other.

In an electroluminescent display according to an embodiment of the present disclosure, a pixel circuit may include at least one of an n-type transistor (NMOS) and a p-type transistor (PMOS). The transistor may be implemented as a thin film transistor (TFT) of a metal oxide semiconductor field effect transistor (MOSFET) structure on a substrate of a display panel. The transistor is a three-electrode element including a gate, a source, and a drain. The source is an electrode that supplies carriers to the transistor. In the transistor, the carriers start to flow from the source. The drain is an electrode through which the carriers exit from the transistor to the outside. The carriers in the transistor flow from the source to the drain. In an instance of the n-type transistor (NMOS), since the carriers are electrons, a source voltage is lower than a drain voltage so that the electrons can flow from the source to the drain. In the n-type transistor (NMOS), a current flows from the drain to the source. In an instance of the p-type transistor (PMOS), since the carriers are holes, the source voltage is higher than the drain voltage so that the holes can flow from the source to the drain. In the p-type transistor (PMOS), the current flows from the source to the drain because the holes flow from the source to the drain. It should be noted that the source and drain of the transistor are not fixed. For example, the source and the drain of the transistor may be changed depending on an applied voltage. Therefore, the disclosure is not limited by the source and the drain of the transistor. In the following description of the embodiment, the source and the drain of the transistor will be referred to as first and second electrodes.

A gate signal applied to the pixel circuit swings between a gate-on voltage and a gate-off voltage. The gate-on voltage is set to a voltage higher than a threshold voltage of the TFT, and the gate-off voltage is set to a voltage lower than the threshold voltage of the TFT. The TFT is turned on in response to the gate-on voltage, while it is turned off in response to the gate-off voltage. In an instance of an n-type TFT, the gate-on voltage may be a gate high voltage (VGH) and the gate-off voltage may be a gate low voltage (VGL). In an instance of a p-type TFT, the gate-on voltage may be the gate low voltage VGL and the gate-off voltage may be the gate high voltage VGH.

Hereinafter, various embodiments of the present disclosure will be described in detail with reference to the accompanying drawings. In the following embodiments, the electroluminescent display will be described mainly with respect to an organic light emitting display device including an organic light emitting material. The technical spirit of the disclosure is not limited to the organic light emitting display device, but can be applied to an inorganic light emitting display device including an inorganic light emitting material.

The present disclosure supplies a data voltage output from a data driver to N (N is an even number of 2 or more) data lines in a time division manner through a channel using a demultiplexer (DEMUX). In the following embodiments, the demultiplexer will be described focusing on a 1:2 MUX structure connecting one output terminal of the data driver to two data lines, but the present disclosure is not limited thereto.

Figure 2:
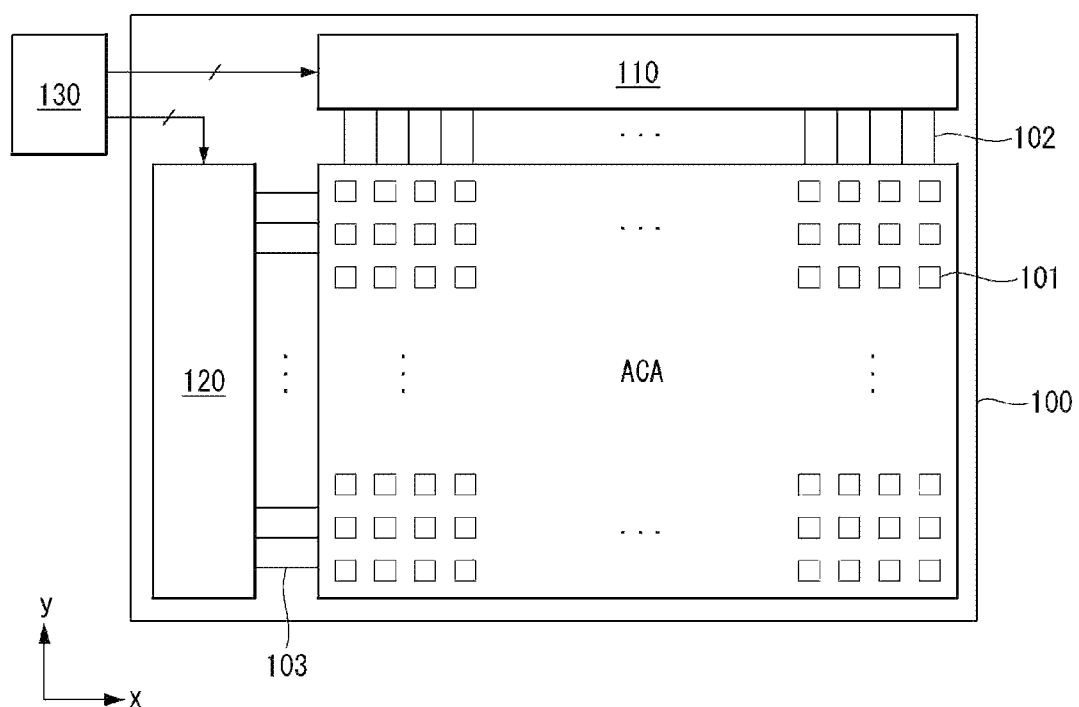
FIG. 2 is a block diagram schematically illustrating an electroluminescent display according to an embodiment of the present disclosure.

FIG. 2 is a block diagram schematically illustrating an electroluminescent display according to an embodiment of the present disclosure.

Referring to FIG. 2, an electroluminescent display according to an embodiment of the present disclosure includes a display panel 100 and a display panel driving circuit.

The display panel 100 includes an active area ACA that displays an input image on a screen. A pixel array is arranged in the active area ACA. The pixel array includes wirings and pixels. The wirings include data lines 102, gate lines 103 orthogonal to the data lines 102, a VDD wiring, and a Vini wiring. A pixel driving voltage, that is, a high level power supply voltage VDD, is supplied to the pixels through the VDD wiring. An initialization voltage Vini is supplied to the pixels through the Vini wiring. The display panel 100 further includes a VSS electrode for supplying a low level power supply voltage VSS to the pixels. The power supply voltages VDD, Vini, and VSS are generated from a power supply circuit (not shown). The power supply voltages may be set to VDD=4.5V, VSS=−2.5V, Vini−3.5V, VGH=7.0V, VGL=−5.5V, but is not limited thereto. The power supply voltages may vary depending on driving characteristics and model of the display panel 100.

The display panel 100 may have various planar shapes. For example, as shown in the drawing, it may include a rectangular shape, a square shape, and a circular shape. A first axis (for example, a y-axis) and a second axis (for example, an x-axis) are defined in the display panel 100 regardless of the planar shape of the display panel 100. A planar shape of a light emitting area, a planar shape of the wirings, and a relationship therebetween may be defined by the first axis and the second axis.

Each of the pixels may be divided into a red sub-pixel, a green sub-pixel, and a blue sub-pixel for color implementation. Each of the pixels may further include a white sub-pixel.

Each of sub-pixels 101 includes a pixel circuit. The pixel circuit includes a light emitting element, a driving TFT, one or more switching elements, and a capacitor. The driving TFT and the switching element may be implemented by a TFT. The pixel circuit of the sub-pixels and a gate driver 120 may be formed directly on a substrate of the display panel 100 in the same manufacturing process. Transistors of the pixel circuit, the demultiplexer, a switch array, and the gate driver 120 may be implemented as NMOS or PMOS transistors and may be implemented as transistors of the same type. The light emitting element may be an organic light emitting diode (OLED). The organic light emitting diode includes a first electrode, a second electrode, and an organic light emitting layer interposed between the first electrode and the second electrode. A first electrode of the organic light emitting diode may be an anode, and a second electrode of the organic light emitting diode may be a cathode.

A light emitting area having a predetermined planar shape is defined in each of the sub-pixels 101. The light emitting area may have a free form planar shape such as a circular shape or an elliptical shape as well as a rectangular shape and a square shape. The light emitting area means an area where light is substantially emitted in the pixel. The light emitting area may be defined on the anode.

As one example, the light emitting area may be defined by a pixel defining layer such as a bank. The bank is formed to cover an edge of the anode and includes an opening area that exposes most of a central portion of the anode. The opening area of the bank may be defined as the light emitting area. As another example, the light emitting area may be defined by a relationship between the anode and the organic light emitting layer. That is, the light emitting area may be defined as an area where the anode and the organic light emitting layer are in contact with each other. Hereinafter, for convenience of explanation, an instance of that the light emitting area is defined by the bank will be described as an example.

Touch sensors may be arranged on the display panel 100. Touch input may be sensed using separate touch sensors or may be sensed through the pixels. The touch sensors may be arranged on the screen of the display panel as an on-cell type or an add-on type or may be implemented as in-cell type touch sensors embedded in the pixel array.

The display panel driving circuit includes a data driver 110 and a gate driver 120. The display panel driving circuit writes data of the input image to the pixels of the display panel 100 under control of a timing controller (TCON) 130. The display panel driving circuit may further include a touch sensor driver for driving the touch sensors. The touch sensor driver is omitted in FIG. 2. In a mobile device, the display panel driving circuit, the timing controller 130 and the power supply circuit may be integrated into one integrated circuit.

The display panel driving circuit may operate in a low refresh mode. The low refresh mode analyzes the input image and reduces power consumption of the display device when the input image has not changed by a preset time. When a still image is input for a predetermined time or more, the low refresh mode can reduce the power consumption by controlling a data writing period of the pixels to be long by lowering refresh rate or frame rate of the pixels. The low refresh mode is not limited to when a still image is input. For example, when the display device operates in a standby mode or when a user command or an input image is not input to the display panel driving circuit for a predetermined time or more, the display panel driving circuit can operate in the low refresh mode.

The data driver 110 may convert digital data of the input image received from the timing controller 130 every frame period into a gamma compensation voltage to generate a data signal. The data driver 110 may output a voltage of the data signal (hereinafter referred to as "data voltage") through an output buffer. The data voltage is supplied to the data lines 102.

The gate driver 120 outputs a gate signal to the gate lines 103 under control of the timing controller 130. The gate driver 120 may shift the gate signal using a shift register to sequentially supply the signals to the gate lines 103. The gate signal includes a scan signal for selecting pixels of a line to which data is to be written and a light emitting switching signal (hereinafter referred to as "EM signal") for defining a light emitting time of pixels charged with the data voltage.

The timing controller 130 receives digital video data of the input image from a host system (not shown) and a timing signal synchronized with the digital video data. The timing signal includes a vertical synchronization signal Vsync, a horizontal synchronization signal Hsync, a clock signal DCLK, and a data enable signal DE.

The host system may be a main board of a television (TV), a set-top box, a navigation system, a personal computer (PC), a home theater system, a mobile device, a wearable device, or the like.

The timing controller 130 can control operation timing of the display panel driving circuit 110 and 120 at a frame frequency of an input frame frequency×i (i is a positive integer larger than 0) Hz by multiplying the input frame frequency and i. The input frame frequency is 60 Hz in the National Television Standards Committee (NTSC) system and 50 Hz in the Phase-Alternating Line (PAL) system. The timing controller 130 may lower the frame frequency to a frequency between 1 Hz and 30 Hz to lower a refresh rate of the pixels in the low refresh mode.

The timing controller 130 generates a data timing control signal for controlling the operation timing of the data driver 110 and a gate timing control signal for controlling the operation timing of the gate driver 120 based on the timing signals (Vsync, Hsync and DE) received from the host system. A voltage level of the gate timing control signal output from the timing controller 130 may be converted into a gate-on voltage and a gate-off voltage through a level shifter (not shown) and supplied to the gate driver 120. The level shifter converts a low level voltage of the gate timing control signal into the gate low voltage VGL and converts a high level voltage of the gate timing control signal into the gate high voltage VGH.

First Embodiment

FIGS. 3 to 6 illustrate positional relationship between a light emitting area and a first wiring in an electroluminescent display according to a first embodiment of the present disclosure. FIG. 7 is a diagram for explaining an effect of the disclosure.

Figure 3:
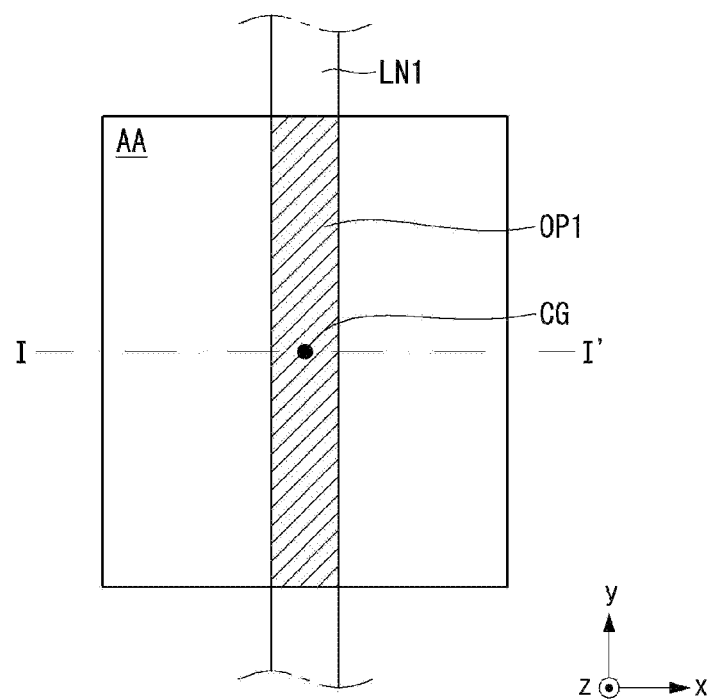
FIGS. 3 to 6 illustrate positional relationship between a light emitting area and a first wiring in an electroluminescent display according to a first embodiment of the present disclosure.
Figure 4:
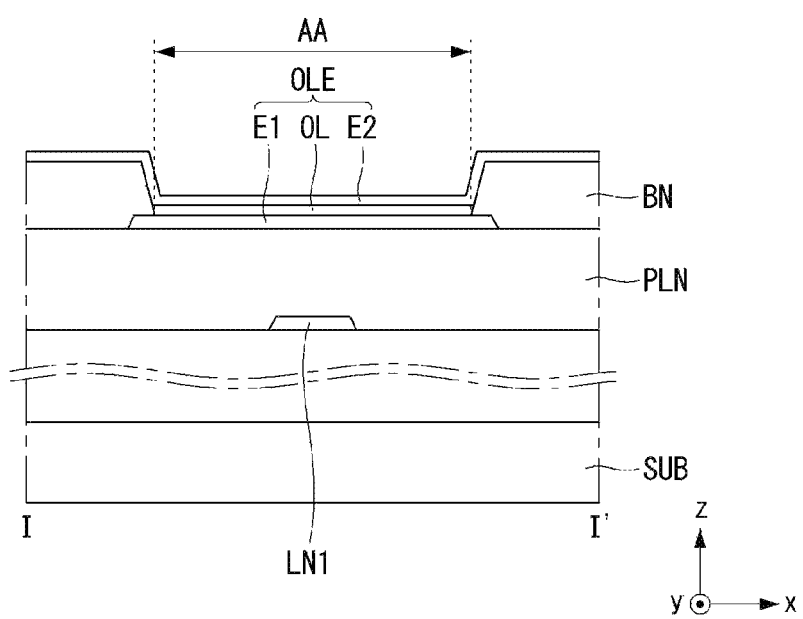

Referring to FIGS. 3 and 4, an electroluminescent display according to a first embodiment of the present disclosure includes a display panel having sub-pixels and wirings to which a signal (or a power supply voltage) for driving the sub-pixels is applied.

Each of the sub-pixels includes a transistor disposed on a substrate SUB and an organic light emitting diode OLE connected to the transistor. The organic light emitting diode OLE includes an anode E1 connected to the transistor, a cathode E2 disposed opposite the anode E1, and an organic light emitting layer OL interposed between the anode E1 and the cathode E2.

In each of the sub-pixels, a light emitting area AA having a predetermined planar shape is defined. The planar shape of the light emitting area AA may be any one selected from various planar shapes such as a polygon, a circle, and an ellipse. As described above, the light emitting area AA may be defined by a bank BN (or a pixel defining layer). The planar shape of the light emitting area AA may be determined by position and shape of an opening area of the bank BN. Therefore, the position and shape of the opening area of the bank BN may be appropriately selected in order to define the light emitting area AA having the predetermined planar shape. The planar shape of the light emitting area AA has a center of gravity CG corresponding to the shape.

A first wiring LN1 of the wirings connected to a sub-pixel for driving the sub-pixel is disposed under the anode E1 with a planarization layer PLN (or an organic insulating layer) interposed therebetween. The first wiring LN1 may be a signal wiring to which a specific signal such as a gate signal and a data signal is applied, and may be a power wiring to which a high level power supply voltage, a low level power supply voltage, and a reference power supply voltage are applied. The planarization layer PLN may be formed of an organic material such as photoacryl, polyimide, benzocyclobutene resin and acrylate resin for planarizing a lower stepped portion.

Figure 5:
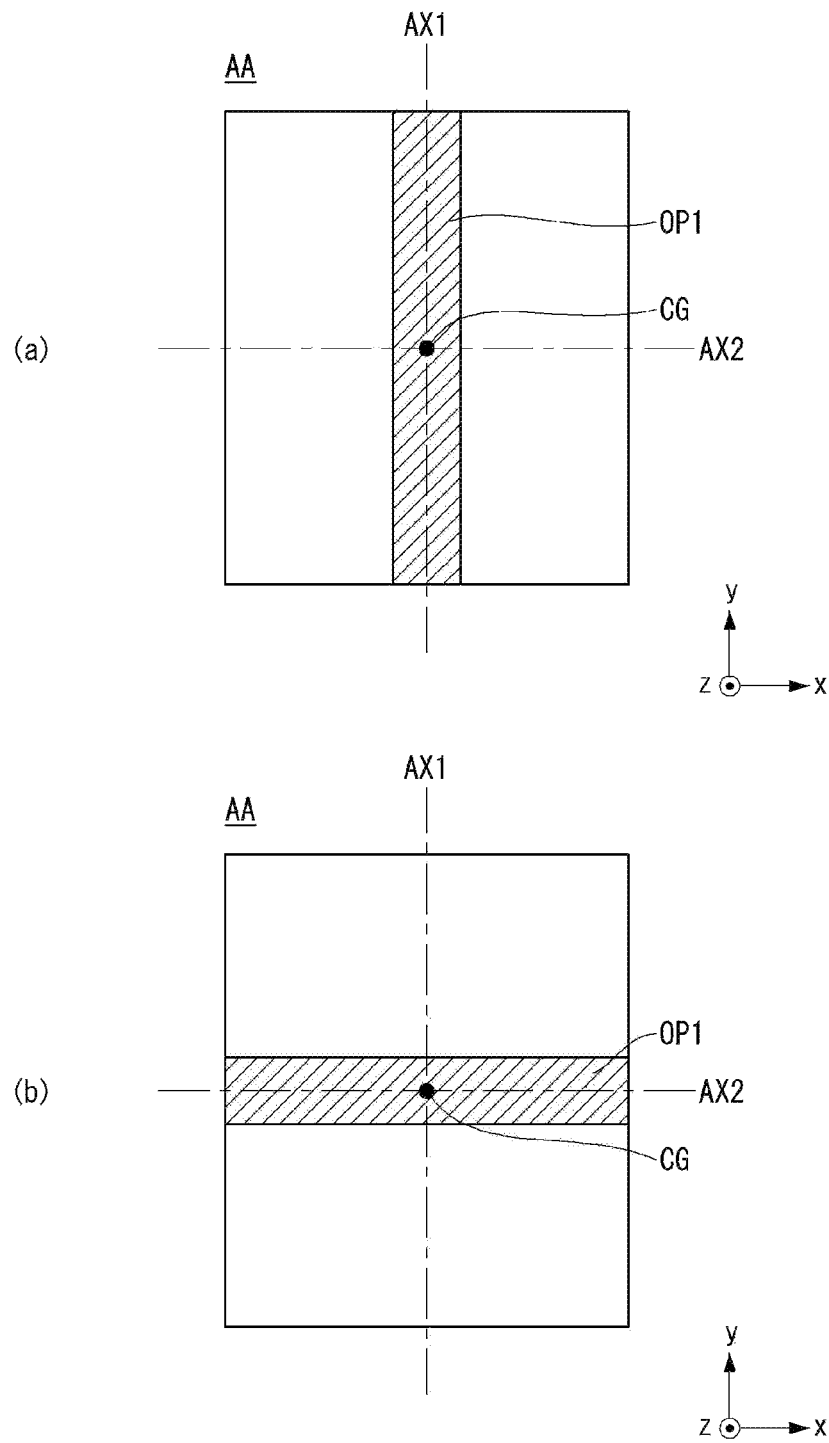
Figure 6:
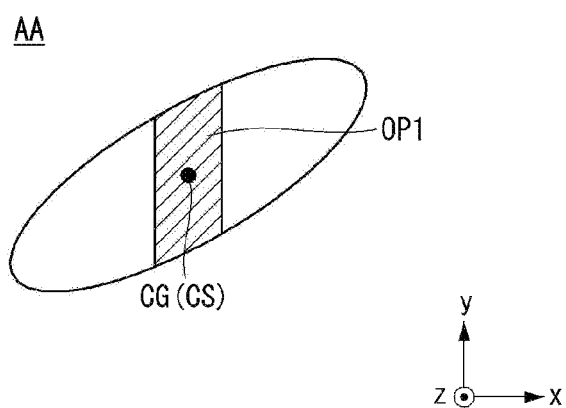
Figure 7:
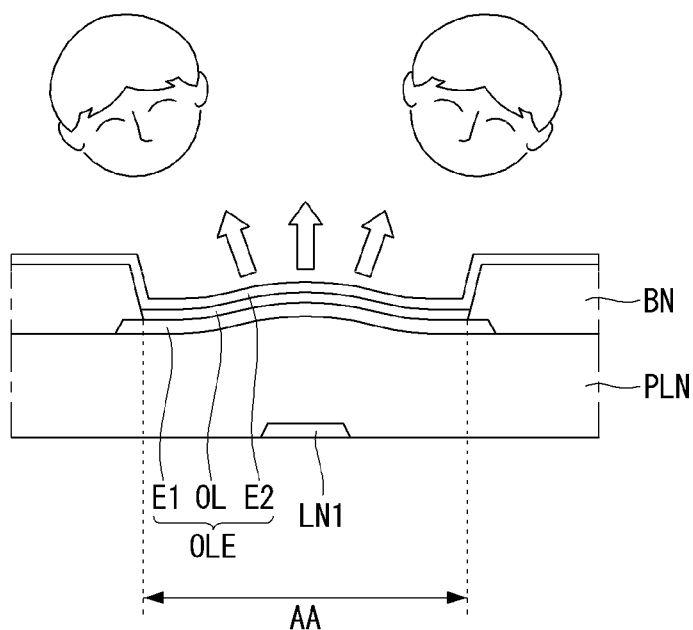
FIG. 7 is a diagram for explaining an effect of the disclosure.

Referring to FIGS. 5 and 6, when viewed from plan, the first wiring LN1 across the light emitting area AA has a shape with symmetry with respect to the center of gravity CG of the light emitting area AA.

Specifically, referring to FIG. 5(a), the first wiring LN1 extends along a first axis direction (for example, the y-axis direction). The first wiring LN1 includes an overlapping portion OP1 overlapping with the light emitting area AA when viewed from plan.

The overlapping portion OP1 of the first wiring LN1 has a predetermined planar shape. The planar shape of the overlapping portion OP1 may have line symmetry with respect to an axis of symmetry. Here, the axis of symmetry is positioned inside the overlapping portion OP1 of the first wiring LN1. In other words, the axis of symmetry passes through the overlapping portion OP1 of the first wiring LN1. The axis of symmetry may be an imaginary line AX1 passing through the center of gravity CG of the light emitting area AA and extending in parallel with the first axis direction. The axis of symmetry may be an imaginary line AX2 passing through the center of gravity CG of the light emitting area AA and extending in parallel with a second axis direction (for example, the x axis direction) perpendicular to the first axis direction.

Referring to FIG. 5(b), the first wiring LN1 extends along the second axis direction. The first wiring LN1 includes an overlapping portion OP1 overlapping with the light emitting area AA when viewed from plan.

The overlapping portion OP1 of the first wiring LN1 has a predetermined planar shape. The planar shape of the overlapping portion OP1 may have line symmetry with respect to an axis of symmetry. Here, the axis of symmetry is positioned inside the overlapping portion OP1 of the first wiring LN1. The axis of symmetry may be an imaginary line AX1 passing through the center of gravity CG of the light emitting area AA and extending in parallel with the first axis direction. The axis of symmetry may be an imaginary line AX2 passing through the center of gravity CG of the light emitting area AA and extending in parallel with a second axis direction.

Referring to FIG. 6, the first wiring LN1 includes an overlapping portion OP1 overlapping with the light emitting area AA when viewed from plan. The overlapping portion OP1 of the first wiring LN1 has a predetermined planar shape. The planar shape of the overlapping portion OP1 may have point symmetry with respect to a center of gravity CG of the light emitting area AA as a center of symmetry CS. Here, the center of gravity CG of the light emitting area AA is positioned inside the overlapping portion OP1 of the first wiring LN1.

When viewed from plan, an area (or extent) of the light emitting area AA corresponding to left side and right side (or upper side and lower side) with respect to the first wiring LN1 overlapping with the light emitting area AA may be substantially the same. Referring to FIGS. 5(a) and 6, the left side area of the light emitting area AA and the right side area of the light emitting area AA with respect to the first wiring LN1 are substantially the same. Referring to FIG. 5(b), the upper side area of the light emitting area AA and the lower side area of the light emitting area AA with respect to the first wiring LN1 are substantially the same.

Referring to FIG. 7, in a preferred embodiment of the present disclosure, the first wiring LN1 across the light emitting area AA is symmetrically disposed with respect to the center of gravity CG of the light emitting area AA, so that directionality of light depending on position can be uniformly dispersed. Therefore, the present disclosure has an advantage that imbalance of a color viewing angle depending on position can be minimized. More specifically, an upper surface of the planarization layer PLN may have a bending by the first wiring LN1 formed to be adjacent to a lower side of the planarization layer PLN. However, by disposing the first wiring LN1 across the light emitting area AA symmetrically with respect to the center of gravity CG of the light emitting area AA, the bending of the upper surface of the planarization layer PLN is symmetrically formed. Thus, the directionality of the light emitted from the light emitting layer OL can be uniformly dispersed. The present disclosure has an advantage that the imbalance of the color viewing angle depending on the position can be minimized.

Second Embodiment

FIGS. 8 to 11 illustrate positional relationship between a light emitting area and a first wiring in an electroluminescent display according to a second embodiment of the present disclosure.

Figure 8:
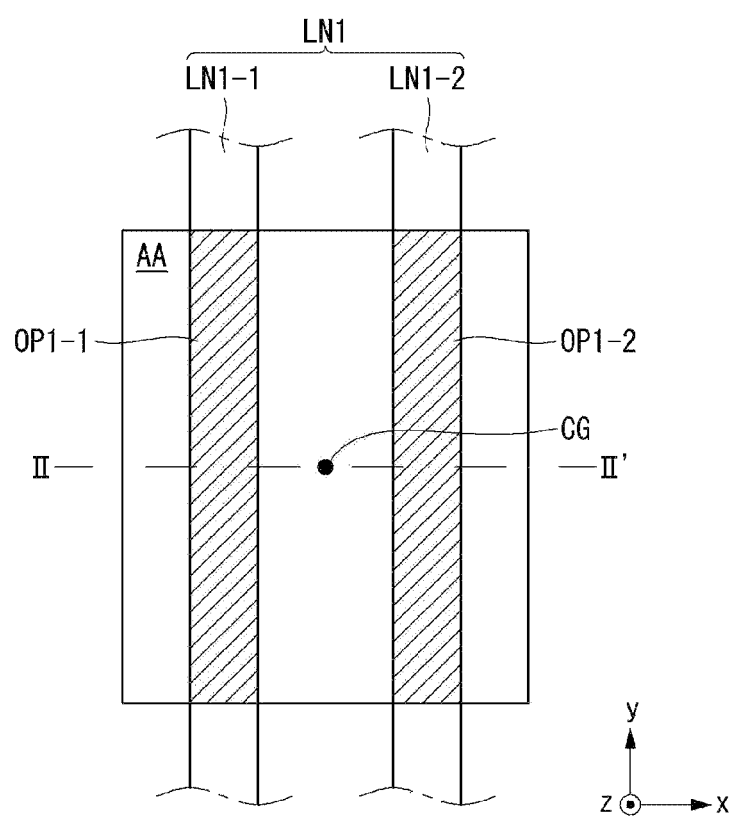
FIGS. 8 to 11 illustrate positional relationship between a light emitting area and a first wiring in an electroluminescent display according to a second embodiment of the present disclosure.
Figure 9:
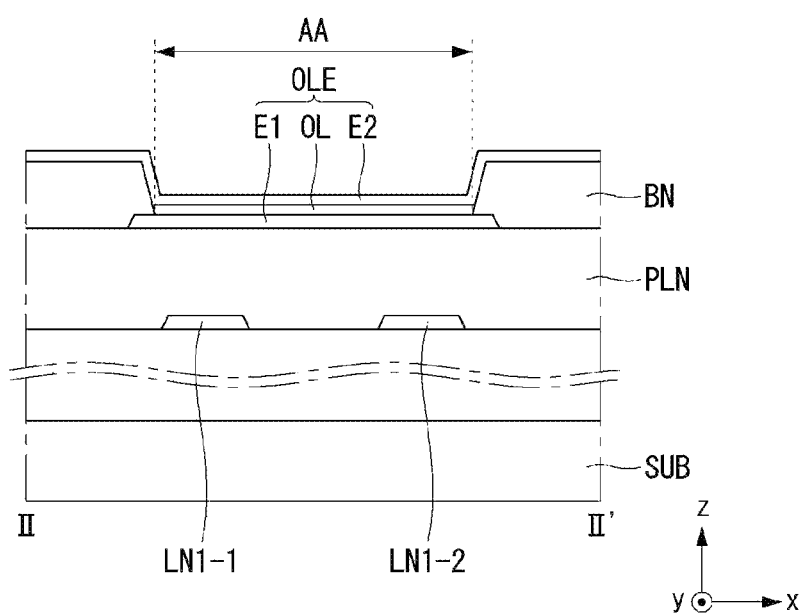

Referring to FIGS. 8 and 9, an electroluminescent display according to a second embodiment of the present disclosure includes a display panel having sub-pixels and wirings to which a signal (or a power supply voltage) for driving the sub-pixels is applied.

Each of the sub-pixels includes a transistor disposed on a substrate SUB and an organic light emitting diode OLE connected to the transistor. The organic light emitting diode OLE includes an anode E1 connected to the transistor, a cathode E2 disposed opposite the anode E1, and an organic light emitting layer OL interposed between the anode E1 and the cathode E2.

In each of the sub-pixels, a light emitting area AA having a predetermined planar shape is defined. The planar shape of the light emitting area AA may be any one selected from various planar shapes such as a polygon, a circle, and an ellipse. As described above, the light emitting area AA may be defined by a bank BN (or a pixel defining layer). The planar shape of the light emitting area AA may be determined by position and shape of an opening area of the bank BN. Therefore, the position and shape of the opening area of the bank BN may be appropriately selected in order to define the light emitting area AA having the predetermined planar shape. The planar shape of the light emitting area AA has a center of gravity CG corresponding to the shape.

A 1-1 wiring LN1-1 and a 1-2 wiring LN1-2 of the wirings connected to a sub-pixel for driving the sub-pixel are disposed under the anode E1 with a planarization layer PLN (or an organic insulating layer) interposed therebetween. The 1-1 wiring LN1-1 and the 1-2 wiring LN1-2 are disposed in parallel. The 1-1 wiring LN1-1 and the 1-2 wiring LN1-2 may be a signal wiring to which a specific signal such as a gate signal and a data signal is applied, and may be a power wiring to which a high level power supply voltage, a low level power supply voltage, and a reference power supply voltage are applied. The same signal may be applied to the 1-1 wiring LN1-1 and the 1-2 wiring LN1-2, or different signals may be applied to the 1-1 wiring LN1-1 and the 1-2 wiring LN1-2. The planarization layer PLN may be formed of an organic material such as photoacryl, polyimide, benzocyclobutene resin and acrylate resin for planarizing a lower stepped portion.

Figure 10:
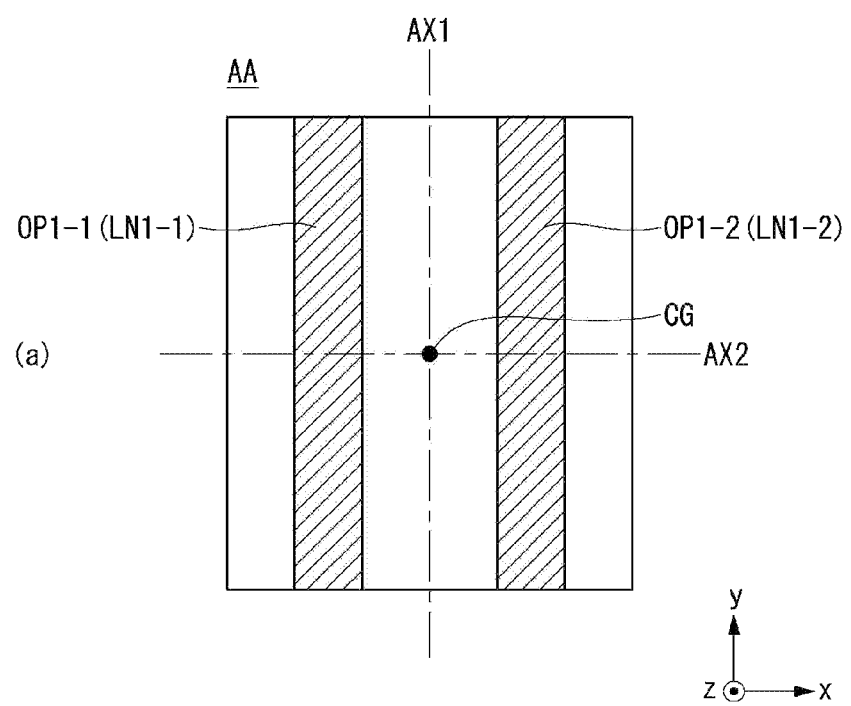
Figure 10:
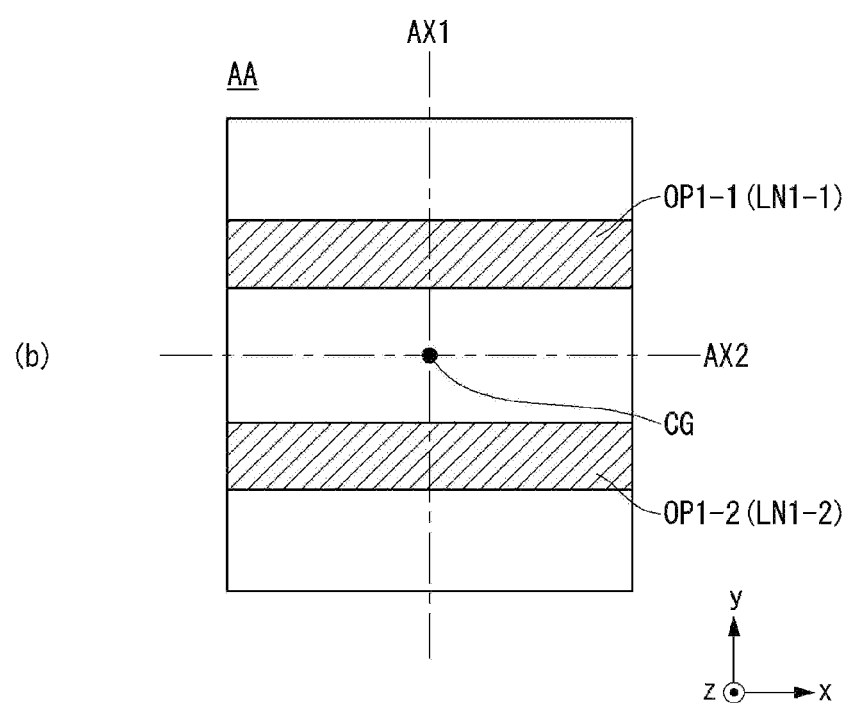
Figure 11:
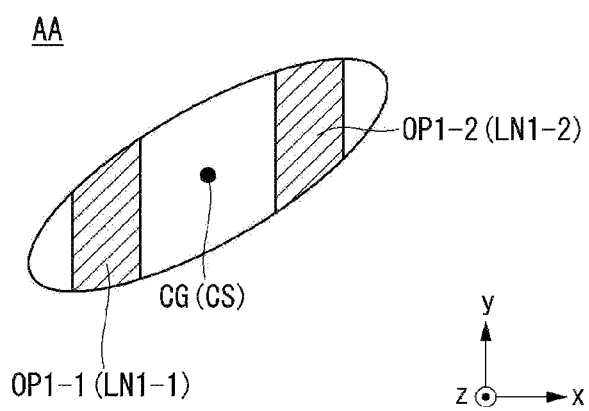

Referring to FIGS. 10 and 11, when viewed from plan, the 1-1 wiring LN1-1 and the 1-2 wiring LN1-2 across the light emitting area AA have a shape with symmetry with respect to the center of gravity CG of the light emitting area AA.

Specifically, referring to FIG. 10(a), the 1-1 wiring LN1-1 and the 1-2 wiring LN1-2 extend along a first axis direction. Each of the 1-1 wiring LN1-1 and the 1-2 wiring LN1-2 includes an overlapping portion overlapping with the light emitting area AA when viewed from plan.

A 1-1 overlapping portion OP1-1 of the 1-1 wiring LN1-1 and a 1-2 overlapping portion OP1-2 of the 1-2 wiring LN1-2 have a predetermined planar shape. The 1-1 overlapping portion OP1-1 of the 1-1 wiring LN1-1 and the 1-2 overlapping portion OP1-2 of the 1-2 wiring LN1-2 have line symmetry with respect to an axis of symmetry. Here, the axis of symmetry is positioned outside the 1-1 overlapping portion OP1-1 of the 1-1 wiring LN1-1 and the 1-2 overlapping portion OP1-2 of the 1-2 wiring LN1-2. In other words, the axis of symmetry does not pass through the 1-2 overlapping portion OP1-1 of the 1-1 wiring LN1-1 and the 1-2 overlapping portion OP1-2 of the 1-2 wiring LN1-2. The axis of symmetry may be an imaginary line AX1 passing through the center of gravity CG of the light emitting area AA and extending in parallel with an extending direction of the 1-1 wiring LN1-1 and the 1-2 wiring LN1-2 that is a first axis direction.

The 1-1 overlapping portion OP1-1 may have line symmetry with respect to an axis of symmetry. Here, the axis of symmetry is positioned inside the 1-1 overlapping portion OP1-1 of the 1-1 wiring LN1-1. The axis of symmetry may be an imaginary line AX2 passing through the center of gravity CG of the light emitting area AA and extending in parallel with a second axis direction perpendicular to an extending direction of the 1-1 wiring LN1-1 and the 1-2 wiring LN1-2.

The 1-2 overlapping portion OP1-2 may have line symmetry with respect to an axis of symmetry. Here, the axis of symmetry is positioned inside the 1-2 overlapping portion OP1-2 of the 1-2 wiring LN1-2. The axis of symmetry may be an imaginary line AX2 passing through the center of gravity CG of the light emitting area AA and extending in parallel with the second axis direction perpendicular to the extending direction of the 1-1 wiring LN1-1 and the 1-2 wiring LN1-2.

Referring to FIG. 10(b), the 1-1 wiring LN1-1 and the 1-2 wiring LN1-2 extends along the second axis direction. The 1-1 wiring LN1-1 and the 1-2 wiring LN1-2 includes an overlapping portion overlapping with the light emitting area AA when viewed from plan.

The 1-1 overlapping portion OP1-1 of the 1-1 wiring LN1-1 and the 1-2 overlapping portion OP1-2 of the 1-2 wiring LN1-2 have a predetermined planar shape. The 1-1 overlapping portion OP1-1 of the 1-1 wiring LN1-1 and the 1-2 overlapping portion OP1-2 of the 1-2 wiring LN1-2 have line symmetry with respect to an axis of symmetry. Here, the axis of symmetry is positioned outside 1-1 overlapping portion OP1-1 of the 1-1 wiring LN1-1 and the 1-2 overlapping portion OP1-2 of the 1-2 wiring LN1-2. The axis of symmetry may be an imaginary line AX2 passing through the center of gravity CG of the light emitting area AA and extending in parallel with the second axis direction in parallel with an extending direction of the 1-1 wiring LN1-1 and the 1-2 wiring LN1-2.

The 1-1 overlapping portion OP1-1 may have line symmetry with respect to an axis of symmetry. Here, the axis of symmetry is positioned inside the 1-1 overlapping portion OP1-1 of the 1-1 wiring LN1-1. The axis of symmetry may be an imaginary line AX1 passing through the center of gravity CG of the light emitting area AA and extending in parallel with the first axis direction perpendicular to the extending direction of the 1-1 wiring LN1-1 and the 1-2 wiring LN1-2.

The 1-2 overlapping portion OP1-2 may have line symmetry with respect to an axis of symmetry. Here, the axis of symmetry is positioned inside the 1-2 overlapping portion OP1-2 of the 1-2 wiring LN1-2. The axis of symmetry may be the imaginary line AX1 passing through the center of gravity CG of the light emitting area AA and extending in parallel with the first axis direction perpendicular to the extending direction of the 1-1 wiring LN1-1 and the 1-2 wiring LN1-2.

Referring to FIG. 11, each of the 1-1 wiring LN1-1 and the 1-2 wiring LN1-2 includes an overlapping portion overlapping with the light emitting area AA when viewed from plan. A 1-1 overlapping portion OP1-1 of the 1-1 wiring LN1-1 and a 1-2 overlapping portion OP1-2 of the 1-2 wiring LN1-2 have a predetermined planar shape. The 1-1 overlapping portion OP1-1 of the 1-1 wiring LN1-1 and the 1-2 overlapping portion OP1-2 of the 1-2 wiring LN1-2 may have point symmetry with respect to a center of gravity CG of the light emitting area AA as a center of symmetry CS. Here, the center of gravity CG of the light emitting area AA being the center of symmetry CS is positioned outside the 1-1 overlapping portion OP1-1 of the 1-1 wiring LN1-1 and the 1-2 overlapping portion OP1-2 of the 1-2 wiring LN1-2.

In a preferred embodiment of the present disclosure, the 1-1 wiring LN1-1 and the 1-2 wiring LN1-2 across the light emitting area AA are symmetrically disposed with respect to the center of gravity CG of the light emitting area AA, so that directionality of light depending on position can be uniformly dispersed. Therefore, the present disclosure has an advantage that imbalance of a color viewing angle depending on the position can be minimized.

Third Embodiment

Figure 12:
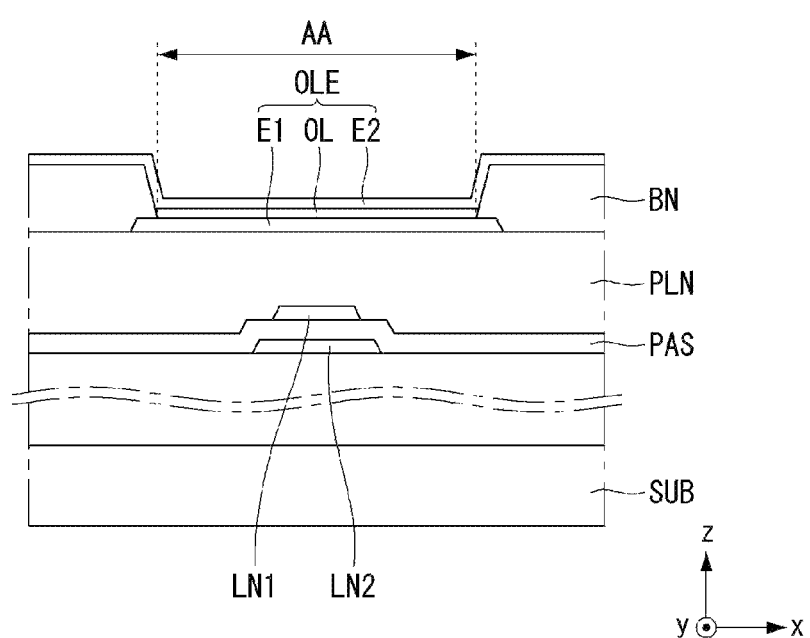
FIGS. 12 and 13 illustrate positional relationship between a light emitting area and a second wiring in an electroluminescent display according to a third embodiment of the present disclosure.
Figure 13:
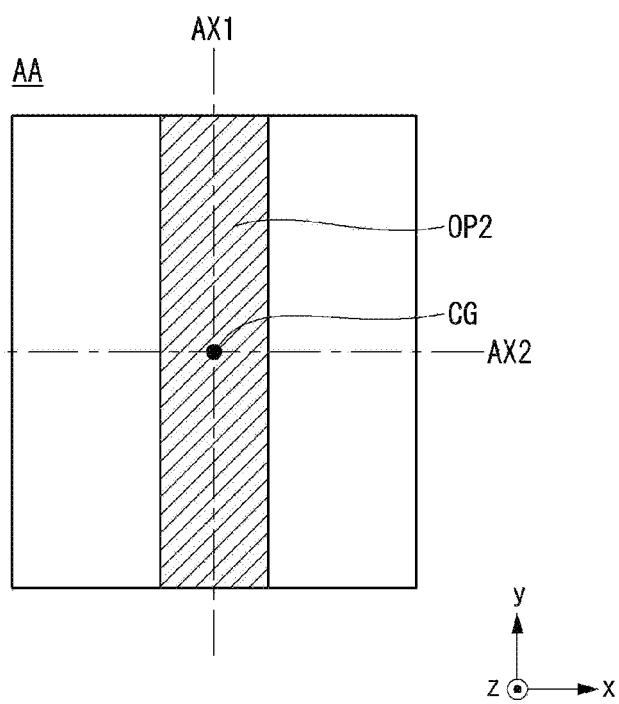

FIGS. 12 and 13 illustrate positional relationship between a light emitting area and a second wiring in an electroluminescent display according to a third embodiment of the present disclosure. In the third embodiment, positional relationship between the light emitting area AA and a first wiring LN1 is substantially the same as that described in the first embodiment or the second embodiment.

Referring to FIG. 12, an electroluminescent display according to a third embodiment of the present disclosure includes a display panel having sub-pixels and wirings to which a signal (or a power supply voltage) for driving the sub-pixels is applied.

Each of the sub-pixels includes a transistor disposed on a substrate SUB and an organic light emitting diode OLE connected to the transistor. The organic light emitting diode OLE includes an anode E1 connected to the transistor, a cathode E2 disposed opposite the anode E1, and an organic light emitting layer OL interposed between the anode E1 and the cathode E2.

In each of the sub-pixels, a light emitting area AA having a predetermined planar shape is defined. The planar shape of the light emitting area AA may be any one selected from various planar shapes such as a polygon, a circle, and an ellipse. As described above, the light emitting area AA may be defined by a bank BN (or a pixel defining layer). The planar shape of the light emitting area AA may be determined by position and shape of an opening area of the bank BN. Therefore, the position and shape of the opening area of the bank BN may be appropriately selected in order to define the light emitting area AA having the predetermined planar shape. The planar shape of the light emitting area AA has a center of gravity CG corresponding to the shape.

A first wiring LN1 of the wirings connected to a sub-pixel for driving the sub-pixel is disposed under the anode E1 with a planarization layer PLN (or an organic insulating layer) interposed therebetween. The first wiring LN1 may be a signal wiring to which a specific signal such as a gate signal and a data signal is applied, and may be a power wiring to which a high level power supply voltage, a low level power supply voltage, and a reference power supply voltage are applied. The planarization layer PLN may be formed of an organic material such as photoacryl, polyimide, benzocyclobutene resin and acrylate resin for planarizing a lower stepped portion.

A second wiring LN2 of the wirings connected to the sub-pixel for driving the sub-pixel is disposed under the first wiring LN1 with a passivation layer PAS (or an inorganic insulating layer) interposed therebetween. The second wiring LN2 may be a signal wiring to which a specific signal such as a gate signal and a data signal is applied, and may be a power wiring to which a high level power supply voltage, a low level power supply voltage, and a reference power supply voltage are applied. The passivation layer PAS may be formed of an inorganic material such as silicon oxide (SiOx) or silicon nitride (SiNx) for protecting the transistor formed underneath.

The passivation layer PAS formed along the stepped portion by the second wiring LN2 has a non-flat and non-uniform surface. That is, since the passivation layer PAS cannot compensate the stepped portion by the second wiring LN2, the second wiring LN2 disposed under the first wiring LN1 with only the passivation layer PAS therebetween may cause the imbalance of the color viewing angle. In order to prevent this, the second wiring LN2 may be arranged as follows.

Referring to FIG. 13, when viewed from plan, the second wiring LN2 across the light emitting area AA has symmetry with respect to the center of gravity CG of the light emitting area AA. That is, the second wiring LN2 according to the third embodiment may be arranged substantially in the same manner as the first wiring LN1 of the first embodiment.

As an example, the second wiring LN2 extends along a first axis direction. The second wiring LN2 includes an overlapping portion overlapping with the light emitting area AA when viewed from plan.

The overlapping portion OP2 of the second wiring LN2 has a predetermined planar shape. The planar shape of the overlapping portion OP2 may have line symmetry with respect to an axis of symmetry. Here, the axis of symmetry is positioned inside the overlapping portion OP2 of the second wiring LN2. In other words, the axis of symmetry passes through the overlapping portion OP2 of the second wiring LN2. The axis of symmetry may be an imaginary line AX1 passing through the center of gravity CG of the light emitting area AA and extending in parallel with the first axis direction. The axis of symmetry may be an imaginary line AX2 passing through the center of gravity CG of the light emitting area AA and extending in parallel with a second axis direction perpendicular to the first axis direction.

In a preferred embodiment of the present disclosure, not only the first wiring LN1 across the light emitting area AA but also the second wiring LN2 positioned under the first wiring LN1 with only the inorganic layer interposed therebetween are symmetrically disposed with respect to the center of gravity CG of the light emitting area AA, so that directionality of light depending on position can be uniformly dispersed. Therefore, the present disclosure has an advantage that imbalance of a color viewing angle depending on the position can be minimized.

Fourth Embodiment

Figure 14:
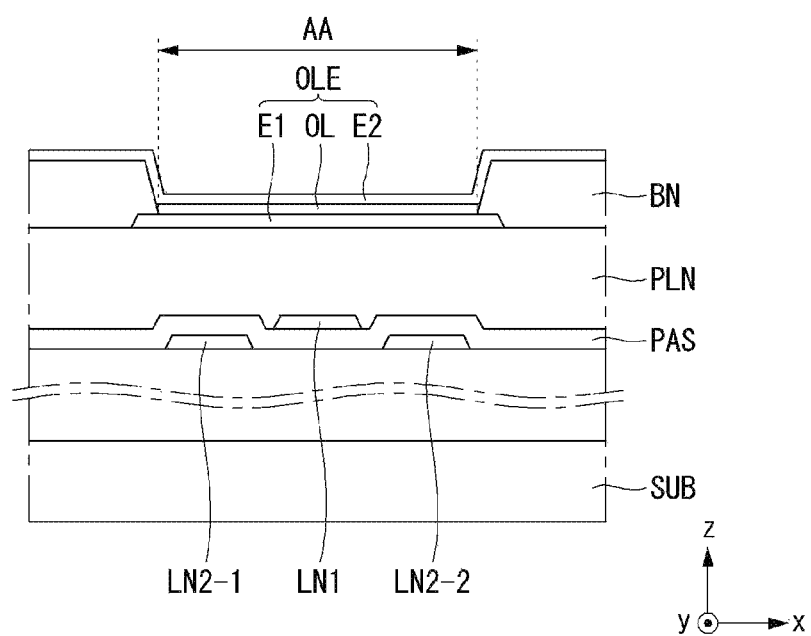
FIGS. 14 and 15 illustrate positional relationship between a light emitting area and a second wiring in an electroluminescent display according to a fourth embodiment of the present disclosure.
Figure 15:
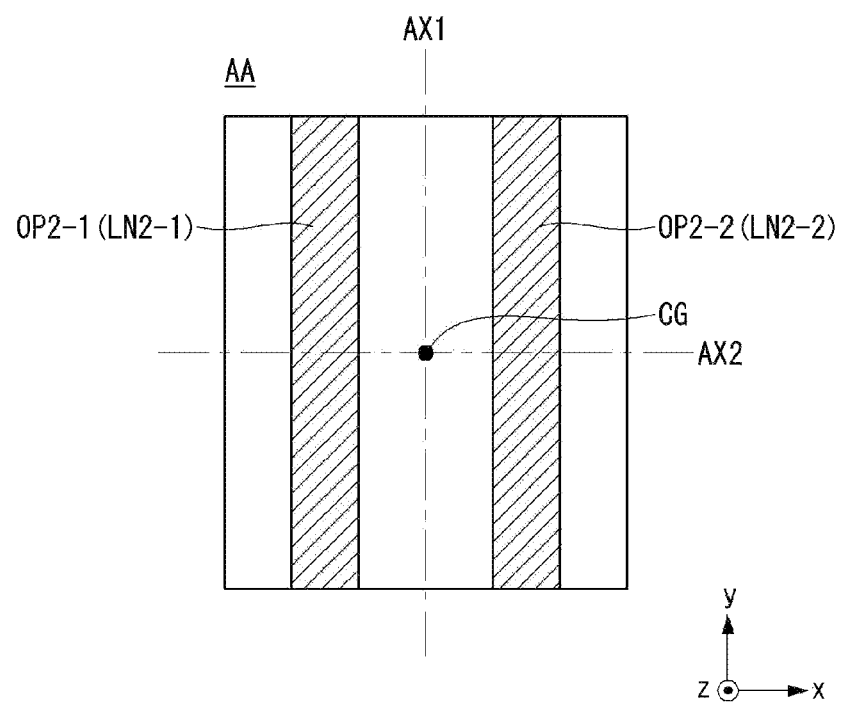

FIGS. 14 and 15 illustrate positional relationship between a light emitting area and a second wiring in an electroluminescent display according to a fourth embodiment of the present disclosure. In the fourth embodiment, positional relationship between the light emitting area AA and a first wiring LN1 is substantially the same as that described in the first embodiment or the second embodiment.

Referring to FIG. 14, an electroluminescent display according to a fourth embodiment of the present disclosure includes a display panel having sub-pixels and wirings to which a signal (or a power supply voltage) for driving the sub-pixels is applied.

Each of the sub-pixels includes a transistor disposed on a substrate SUB and an organic light emitting diode OLE connected to the transistor. The organic light emitting diode OLE includes an anode E1 connected to the transistor, a cathode E2 disposed opposite the anode E1, and an organic light emitting layer OL interposed between the anode E1 and the cathode E2.

In each of the sub-pixels, a light emitting area AA having a predetermined planar shape is defined. The planar shape of the light emitting area AA may be any one selected from various planar shapes such as a polygon, a circle, and an ellipse. As described above, the light emitting area AA may be defined by a bank BN (or a pixel defining layer). The planar shape of the light emitting area AA may be determined by position and shape of an opening area of the bank BN. Therefore, the position and shape of the opening area of the bank BN may be appropriately selected in order to define the light emitting area AA having the predetermined planar shape. The planar shape of the light emitting area AA has a center of gravity CG corresponding to the shape.

A first wiring LN1 of the wirings connected to a sub-pixel for driving the sub-pixel is disposed under the anode E1 with a planarization layer PLN (or an organic insulating layer) interposed therebetween. The first wiring LN1 may be a signal wiring to which a specific signal such as a gate signal and a data signal is applied, and may be a power wiring to which a high level power supply voltage, a low level power supply voltage, and a reference power supply voltage are applied. The planarization layer PLN may be formed of an organic material such as photoacryl, polyimide, benzocyclobutene resin and acrylate resin for planarizing a lower stepped portion.

A second wiring LN2 of the wirings connected to a sub-pixel for driving the sub-pixel is disposed under the first wiring LN1 with a passivation layer PAS (or an inorganic insulating layer) interposed therebetween. The second wiring LN2 may be a signal wiring to which a specific signal such as a gate signal and a data signal is applied, and may be a power wiring to which a high level power supply voltage, a low level power supply voltage, and a reference power supply voltage are applied. The passivation layer PAS may be formed of an inorganic material such as silicon oxide (SiOx) or silicon nitride (SiNx) for protecting the transistor formed underneath.

The passivation layer PAS formed along the stepped portion by the second wiring LN2 has a non-flat and non-uniform surface. That is, since the passivation layer PAS cannot compensate the stepped portion by the second wiring LN2, the second wiring LN2 disposed under the first wiring LN1 with only the passivation layer PAS interposed therebetween may cause the imbalance of the color viewing angle. In order to prevent this, the second wiring LN2 may be arranged as follows.

Referring to FIG. 15, the second wiring LN2 includes a 2-1 wiring LN2-1 and a 2-2 wiring LN2-2 arranged in parallel with each other. The same signal may be applied to the 2-1 wiring LN2-1 and the 2-2 wiring LN2-2, or different signals may be applied the 2-1 wiring LN2-1 and the 2-2 wiring LN2-2. When viewed from plan, the 2-1 wiring LN2-1 and the 2-2 wiring LN2-2 across the light emitting area AA have symmetry with respect to the center of gravity CG of the light emitting area AA. That is, the second wiring LN2 according to the fourth embodiment may be arranged substantially in the same manner as the first wiring LN1 of the second embodiment.

As an example, the 2-1 wiring LN2-1 and the 2-2 wiring LN2-2 extends along a first axis direction. Each of the 2-1 wiring LN2-1 and the 2-2 wiring LN2-2 includes an overlapping portion overlapping with the light emitting area AA when viewed from plan.

A 2-1 overlapping portion OP2-1 of the 2-1 wiring LN2-1 and a 2-2 overlapping portion OP2-2 of the 2-2 wiring LN2-2 have a predetermined planar shape. The 2-1 overlapping portion OP2-1 of the 2-1 wiring LN2-1 and the 2-2 overlapping portion OP2-2 of the 2-2 wiring LN2-2 have line symmetry with respect to an axis of symmetry. Here, the axis of symmetry is positioned outside the 2-1 overlapping portion OP2-1 of the 2-1 wiring LN2-1 and the 2-2 overlapping portion OP2-2 of the 2-2 wiring LN2-2. In other words, the axis of symmetry does not pass through the 2-1 overlapping portion OP2-1 of the 2-1 wiring LN2-1 and the 2-2 overlapping portion OP2-2 of the 2-2 wiring LN2-2. The axis of symmetry may be an imaginary line AX1 passing through the center of gravity CG of the light emitting area AA and extending in parallel with an extending direction of the 2-1 wiring LN2-1 and the 2-2 wiring LN2-2 that is the first axis direction.

The 2-1 overlapping portion OP2-1 may have line symmetry with respect to an axis of symmetry. Here, the axis of symmetry is positioned inside the 2-1 overlapping portion OP2-1 of the 2-1 wiring LN2-1. The axis of symmetry may be an imaginary line AX2 passing through the center of gravity CG of the light emitting area AA and extending in parallel with a second axis direction perpendicular to the extending direction of the 2-1 wiring LN2-1 and the 2-2 wiring LN2-2.

The 2-2 overlapping portion OP2-2 may have line symmetry with respect to an axis of symmetry. Here, the axis of symmetry is positioned inside the 2-2 overlapping portion OP2-2 of the 2-2 wiring LN2-2. The axis of symmetry may be the imaginary line AX2 passing through the center of gravity CG of the light emitting area AA and extending in parallel with the second axis direction perpendicular to the extending direction of the 2-1 wiring LN2-1 and the 2-2 wiring LN2-2.

In a preferred embodiment of the present disclosure, not only the first wiring LN1 across the light emitting area AA but also the second wiring LN2 positioned under the first wiring LN1 with only the inorganic layer interposed therebetween are symmetrically disposed with respect to the center of gravity CG of the light emitting area AA, so that directionality of light depending on position can be uniformly dispersed. Therefore, the present disclosure has an advantage that imbalance of a color viewing angle depending on the position can be minimized.

Fifth Embodiment

Figure 16:
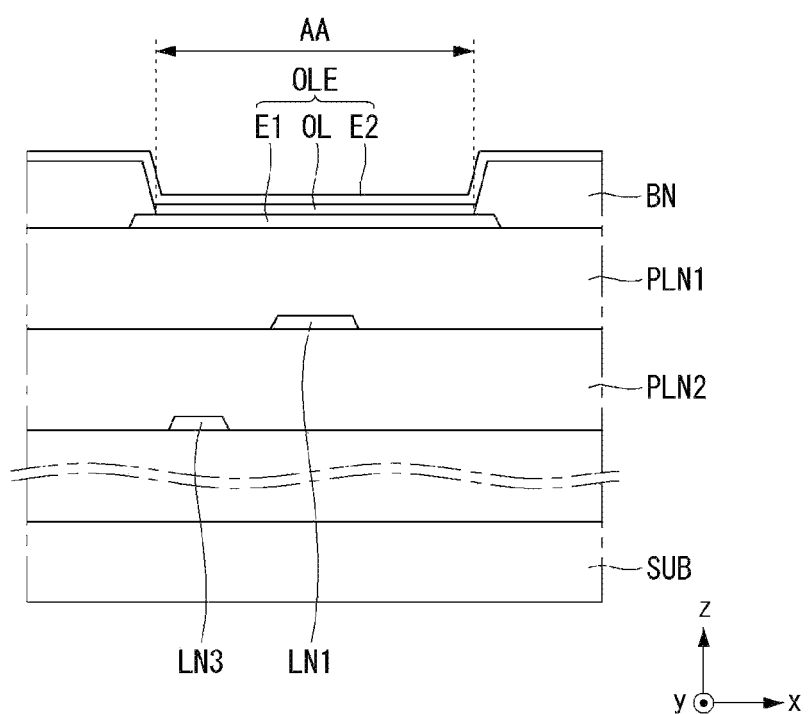
FIG. 16 illustrates positional relationship between a light emitting area and a third wiring in an electroluminescent display according to a fifth embodiment of the present disclosure.

FIG. 16 illustrates positional relationship between a light emitting area and a third wiring in an electroluminescent display according to a fifth embodiment of the present disclosure. In the fifth embodiment, positional relationship between the light emitting area AA and a first wiring LN1 is substantially the same as that described in the first embodiment or the second embodiment.

Referring to FIG. 16, an electroluminescent display according to a fifth embodiment of the present disclosure includes a display panel having sub-pixels and wirings to which a signal (or a power supply voltage) for driving the sub-pixels is applied.

Each of the sub-pixels includes a transistor disposed on a substrate SUB and an organic light emitting diode OLE connected to the transistor. The organic light emitting diode OLE includes an anode E1 connected to the transistor, a cathode E2 disposed opposite the anode E1, and an organic light emitting layer OL interposed between the anode E1 and the cathode E2.

In each of the sub-pixels, a light emitting area AA having a predetermined planar shape is defined. The planar shape of the light emitting area AA may be any one selected from various planar shapes such as a polygon, a circle, and an ellipse. As described above, the light emitting area AA may be defined by a bank BN (or a pixel defining layer). The planar shape of the light emitting area AA may be determined by position and shape of an opening area of the bank BN. Therefore, the position and shape of the opening area of the bank BN may be appropriately selected in order to define the light emitting area AA having the predetermined planar shape. The planar shape of the light emitting area AA has a center of gravity CG corresponding to the shape.

A first wiring LN1 of the wirings connected to a sub-pixel for driving the sub-pixel is disposed under the anode E1 with a first planarization layer PLN1 (or a first organic insulating layer) interposed therebetween. The first wiring LN1 may be a signal wiring to which a specific signal such as a gate signal and a data signal is applied, and may be a power wiring to which a high level power supply voltage, a low level power supply voltage, and a reference power supply voltage are applied. The first planarization layer PLN1 may be formed of an organic material such as photoacryl, polyimide, benzocyclobutene resin and acrylate resin for planarizing a lower stepped portion.

A third wiring LN3 of the wirings connected to a sub-pixel for driving the sub-pixel is disposed under the first wiring LN1 with an insulating layer interposed therebetween. The third wiring LN3 may be a signal wiring to which a specific signal such as a gate signal and a data signal is applied, and may be a power wiring to which a high level power supply voltage, a low level power supply voltage, and a reference power supply voltage are applied.

The third wiring LN3 is a wiring which is arranged without satisfying the arrangement condition of the first wiring LN1 described in the first and second embodiments and the second wiring LN2 described in the third and fourth embodiments. Therefore, the third wiring LN3 may be an element that may cause an imbalance problem of a color viewing angle. In order to solve the imbalance problem of the color viewing angle which can be caused by the third wiring LN3, the fifth embodiment of the present disclosure is characterized in that a second planarization layer PLN2 (or a second organic insulating layer) is further formed on the third wiring LN3 to cover the third wiring LN3. That is, in the fifth embodiment of the present disclosure, the insulating layer interposed between the first wiring LN1 and the third wiring LN3 may be selected as the second planarization layer PLN2. The second planarization layer PLN2 may be formed of an organic material such as photoacryl, polyimide, benzocyclobutene resin and acrylate resin for planarizing a lower stepped portion.

In the fifth embodiment according to the present disclosure, when the third wiring LN3 disposed under the first wiring LN1 with the insulating layer interposed therebetween cannot be symmetrically disposed with respect to the center of gravity CG of the light emitting area AA, the insulating layer interposed between the first wiring line LN1 and the third wiring line LN3 is set as an organic insulating layer so as to prevent defect of a color viewing angle that may occur due to the third wiring line LN3. Thus, in the fifth embodiment according to the present disclosure, since the stepped portion by the third wiring LN3 can be sufficiently compensated by using the first planarization layer PLN1 and the second planarization layer PLN2, it is possible to remarkably reduce the imbalance of the color viewing angle.

According to the fifth embodiment, a wiring formed under the first planarization layer PLN1 may be formed so as not to overlap with the light emitting area AA, or a wiring formed to overlap with the light emitting area AA can be disposed symmetrically with respect to the center of gravity CG like the first wiring LN1. However, like the third wiring LN3, in an instance of a wiring which is formed so as to overlap with the light emitting area AA but cannot be disposed symmetrically with respect to the center of gravity CG of the light emitting area AA, the second planarization layer PLN2 is further formed under the first planarization layer PLN1 and a wiring is formed under the second planarization layer PLN2. Therefore, it is possible to sufficiently compensate the stepped portion generated by the wiring disposed asymmetrically with respect to the center of gravity CG of the light emitting area AA.

For example, the second planarization layer PLN2 and the first planarization layer PLN1 on the second planarization layer PLN2 may be disposed. Here, the first wiring LN1 symmetrically disposed with respect to the center of gravity CG of the light emitting area AA may be positioned between the first planarization layer PLN1 and the second planarization layer PLN2, and the third wiring LN3 which is not symmetrically disposed with respect to the center of gravity CG of the light emitting area AA may be positioned under the second planarization layer PLN2.

Sixth Embodiment

Figure 17:
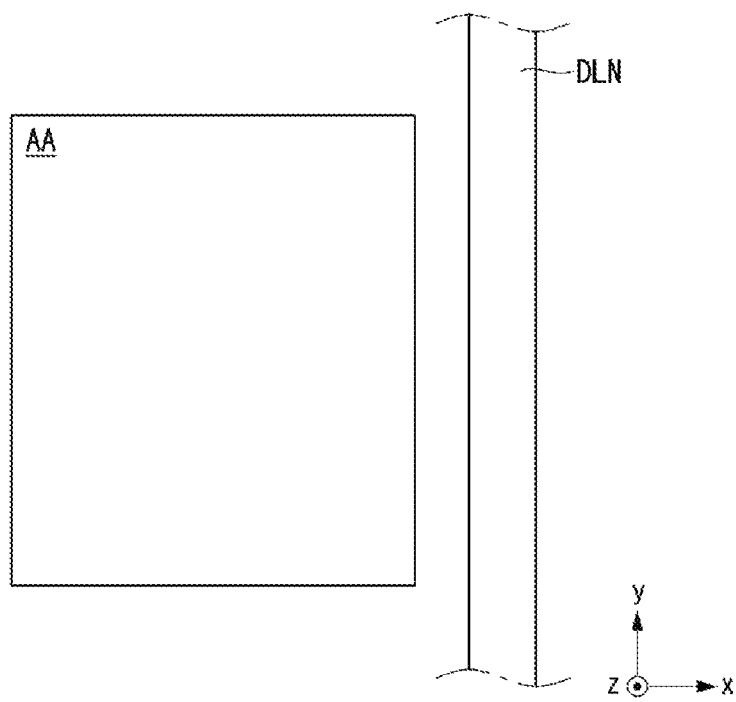
FIG. 17 illustrates positional relationship between a light emitting area and a bypass wiring in an electroluminescent display according to a sixth embodiment of the present disclosure.

FIG. 17 illustrates positional relationship between a light emitting area and a bypass wiring in an electroluminescent display according to a sixth embodiment of the present disclosure. In the sixth embodiment, positional relationship between the light emitting area AA and a first wiring LN1 is substantially the same as that described in the first embodiment or the second embodiment.

Referring to FIG. 17, an electroluminescent display according to a sixth embodiment of the present disclosure includes a display panel having sub-pixels and wirings to which a signal (or a power supply voltage) for driving the sub-pixels is applied.

Each of the sub-pixels includes a transistor disposed on a substrate SUB and an organic light emitting diode OLE connected to the transistor. The organic light emitting diode OLE includes an anode E1 connected to the transistor, a cathode E2 disposed opposite the anode E1, and an organic light emitting layer OL interposed between the anode E1 and the cathode E2.

In each of the sub-pixels, a light emitting area AA having a predetermined planar shape is defined. The planar shape of the light emitting area AA may be any one selected from various planar shapes such as a polygon, a circle, and an ellipse. As described above, the light emitting area AA may be defined by a bank BN (or a pixel defining layer). The planar shape of the light emitting area AA may be determined by position and shape of an opening area of the bank BN. Therefore, the position and shape of the opening area of the bank BN may be appropriately selected in order to define the light emitting area AA having the predetermined planar shape. The planar shape of the light emitting area AA has a center of gravity CG corresponding to the shape.

The first wiring LN1 of the wirings connected to a sub-pixel for driving the sub-pixel is disposed under the anode E1 with a planarization layer PLN (or an organic insulating layer) interposed therebetween. The first wiring LN1 may be a signal wiring to which a specific signal such as a gate signal and a data signal is applied, and may be a power wiring to which a high level power supply voltage, a low level power supply voltage, and a reference power supply voltage are applied. The planarization layer PLN may be formed of an organic material such as photoacryl, polyimide, benzocyclobutene resin and acrylate resin for planarizing a lower stepped portion.

A bypass wiring DLN of the wirings connected to a sub-pixel for driving the sub-pixel is disposed under the anode E1 with the planarization layer PLN interposed therebetween. That is, the bypass wiring DLN is a wiring disposed in the same layer as the first wiring LN1. The bypass wiring DLN may be a signal wiring to which a specific signal such as a gate signal and a data signal is applied, and may be a power wiring to which a high level power supply voltage, a low level power supply voltage, and a reference power supply voltage are applied. The bypass wiring DLN may be a wiring to which the same signal (or power supply voltage) as that of the first wiring LN1 is applied. The bypass wiring DLN may be formed separately from the first wiring LN1 or may be formed as one body with the first wiring LN1.

The bypass wiring DLN is a wiring which is arranged without satisfying the arrangement condition of the first wiring LN1 described in the first and second embodiments and the second wiring LN2 described in the third and fourth embodiments. Therefore, the bypass wiring DLN may be an element that may cause an imbalance problem of the color viewing angle. In order to solve the imbalance problem of the color viewing angle which can be caused by the bypass wiring DLN, the sixth embodiment of the present disclosure is characterized in that the bypass wiring DLN is disposed so as not to overlap with the light emitting area AA. That is, the bypass wiring DLN is disposed to bypass the light emitting area AA so as not to overlap with the light emitting area AA when viewed from plan.

In a preferred embodiment of the present disclosure, a wiring disposed under the anode E1 with the planarization layer PLN interposed therebetween is limited to one of the first wiring LN1 satisfying the arrangement conditions described in the first and second embodiments and the bypass wiring DLN satisfying the arrangement condition described in the sixth embodiment.

In the preferred embodiment of the present disclosure, the bypass wiring DLN which is difficult to be disposed so as to be symmetrical with respect to the center of gravity CG of the light emitting area AA is disposed to bypass the light emitting area AA so as not to overlap with the light emitting area AA, so that directionality of light emitted from the light emitting area AA can be uniformly dispersed. Therefore, the present disclosure has an advantage that imbalance of a color viewing angle depending on position can be minimized.

Seventh Embodiment

Figure 18:
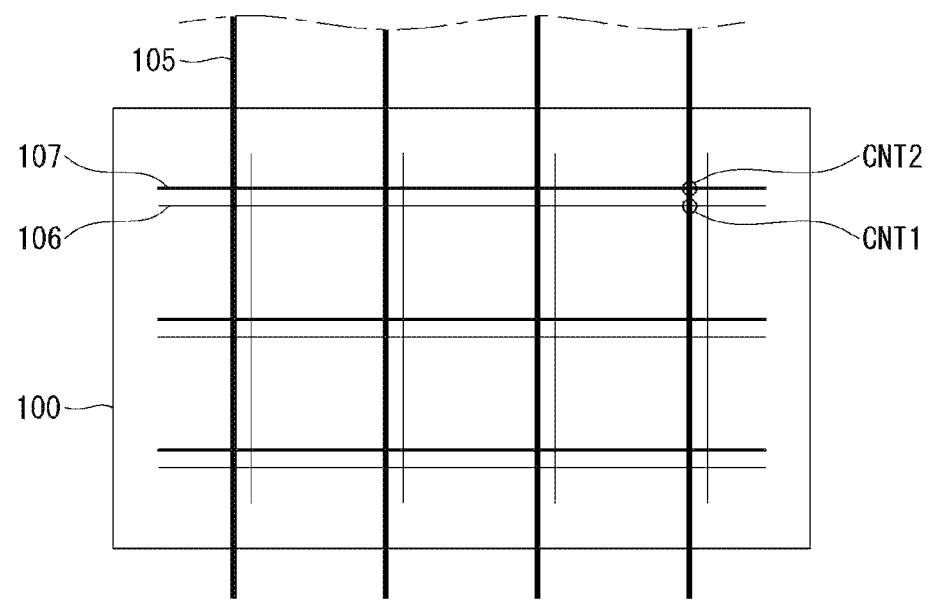
FIGS. 18 to 20 illustrate a structure of a VDD wiring and an auxiliary wiring in an electroluminescent display according to a seventh embodiment of the present disclosure.
Figure 19:
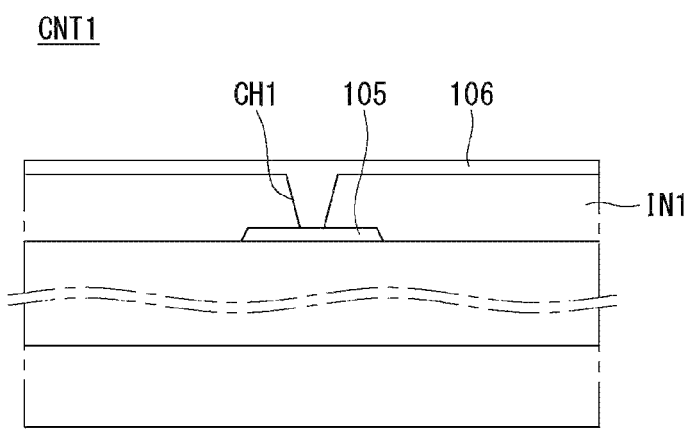
Figure 20:
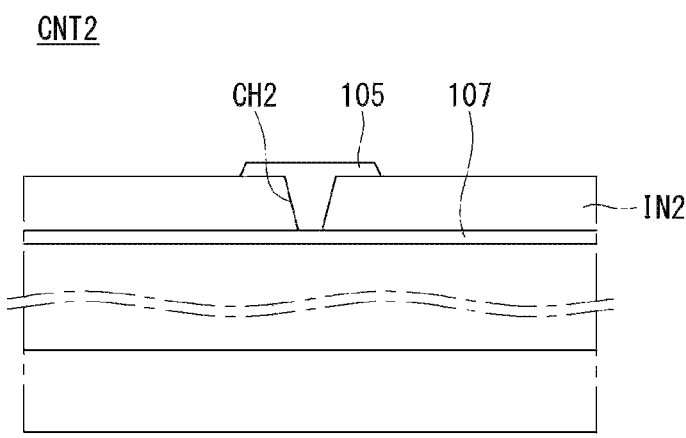

FIGS. 18 to 20 illustrate a structure of a VDD wiring and an auxiliary wiring in an electroluminescent display according to a seventh embodiment of the present disclosure. The seventh embodiment of the present disclosure proposes a solution to solve a defect that light emission luminance is not uniform by varying an amount of current supplied in each pixel with respect to the same data signal due to a voltage drop of the VDD wiring depending on the position of each sub-pixel while improving the imbalance of the color viewing angle.

Referring to FIGS. 18 to 20, a display panel 100 includes a plurality of sub-pixels, and the sub-pixels can be driven by receiving various signals through a plurality of wirings. Among them, the VDD wiring 105 receives a high level power supply voltage having a constant level from a power generating unit (not shown) and supplies the high level power supply voltage to each sub-pixel.

In an instance of a large-area electroluminescent display, a uniform luminance cannot be maintained on an entire surface of an active area in which an input image is implemented, and a luminance deviation may occur depending on the position. More specifically, there arises a problem that the high level power supply voltage applied to each sub-pixel does not have a uniform voltage value across the entire surface. For example, as a deviation between a voltage value at a lead-in portion to which a power supply voltage is applied and a voltage value at a position apart from the lead-in portion increases by line resistance of the VDD wiring 105, the luminance deviation depending on the position increases. That is, a voltage drop (IR DROP) of the VDD wiring 105 is relatively small in the vicinity of the power generating unit, while the voltage drop of the VDD wiring 105 is relatively large as a distance from the power generating unit increases.

The seventh embodiment of the present disclosure includes an auxiliary wiring disposed in a different layer from the VDD wiring 105 with at least one insulating layer interposed therebetween in order to reduce the line resistance of the VDD wiring 105. The auxiliary wiring may be made of a low resistance metal.

The auxiliary wiring includes a first auxiliary wiring 106 and a second auxiliary wiring 107 which are arranged in different layers. The VDD wiring 105 may be interconnected with the first auxiliary wiring 106 through a contact hole CH1 passing through an insulating layer IN1 disposed between the VDD wiring 105 and the first auxiliary wiring 106. The VDD wiring 105 may be interconnected with the second auxiliary wiring 107 through a contact hole CH2 passing through an insulating layer IN2 disposed between the VDD wiring 105 and the second auxiliary wiring 107. Reference numeral CNT1 denotes a connection area between the VDD wiring 105 and the first auxiliary wiring 106. Reference numeral CNT2 denotes a connection area between the VDD wiring 105 and the second auxiliary wiring 107.

The first auxiliary wiring 106 may extend in the first axis direction or the second axis direction, and may be arranged in a mesh shape extending in both the first axis direction and the second axis direction. The second auxiliary wiring 107 may extend in the first axis direction or the second axis direction, and may be arranged in a mesh shape extending in both the first axis direction and the second axis direction. The first auxiliary wiring 106 and the second auxiliary wiring 107 may be selectively arranged at appropriate positions in consideration of the relationship with other wirings disposed on the same layer. The seventh embodiment of the present disclosure electrically connects the auxiliary wirings 106 and 107 having low resistance to the VDD wiring 105, so that it is possible to minimize the defect of the non-uniformity in luminance due to the voltage drop of the VDD wiring 105.

Figure 21:
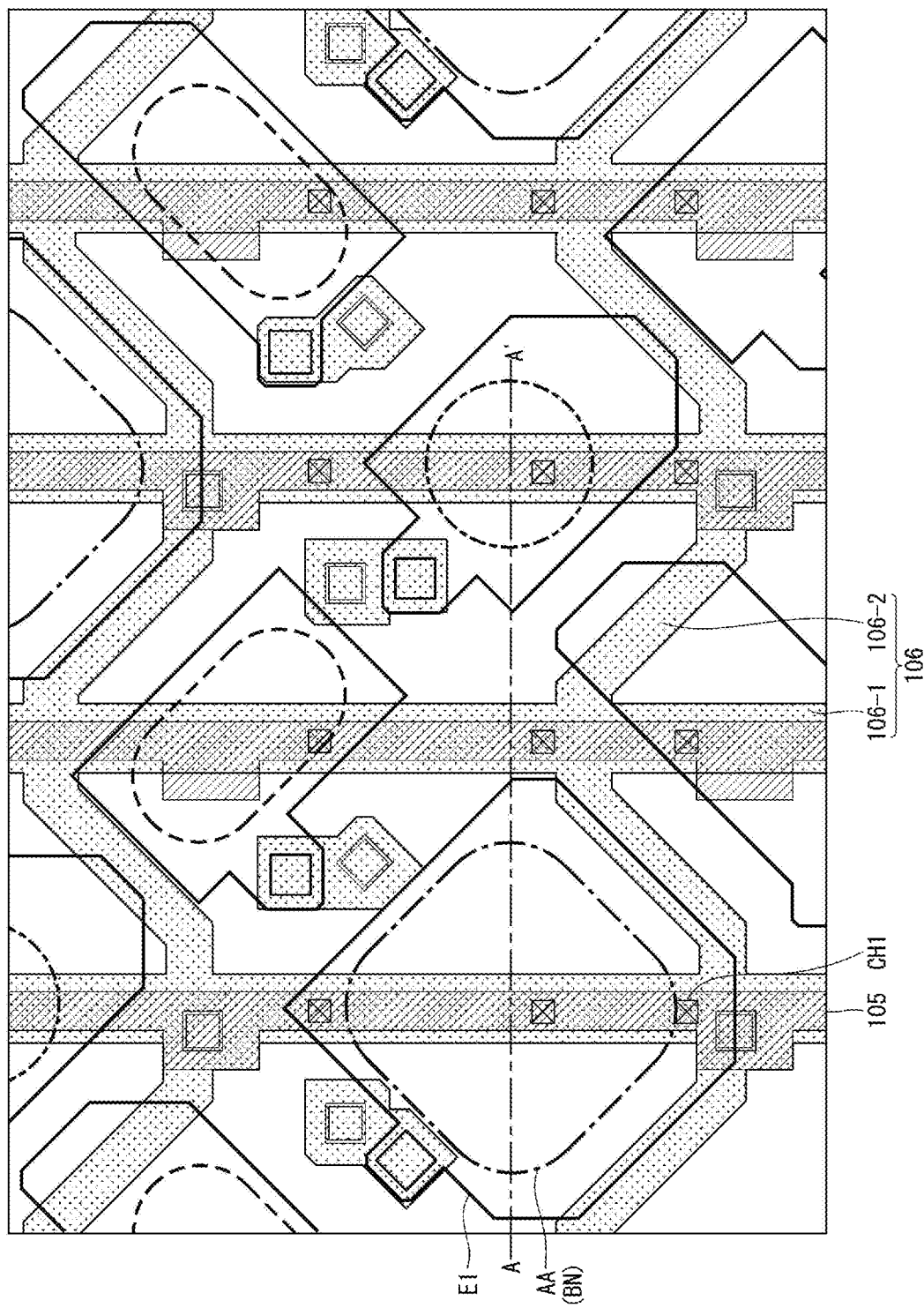
FIG. 21 is a diagram illustrating a configuration example of a pixel circuit in an electroluminescent display according to a seventh embodiment of the present disclosure.
Figure 22:
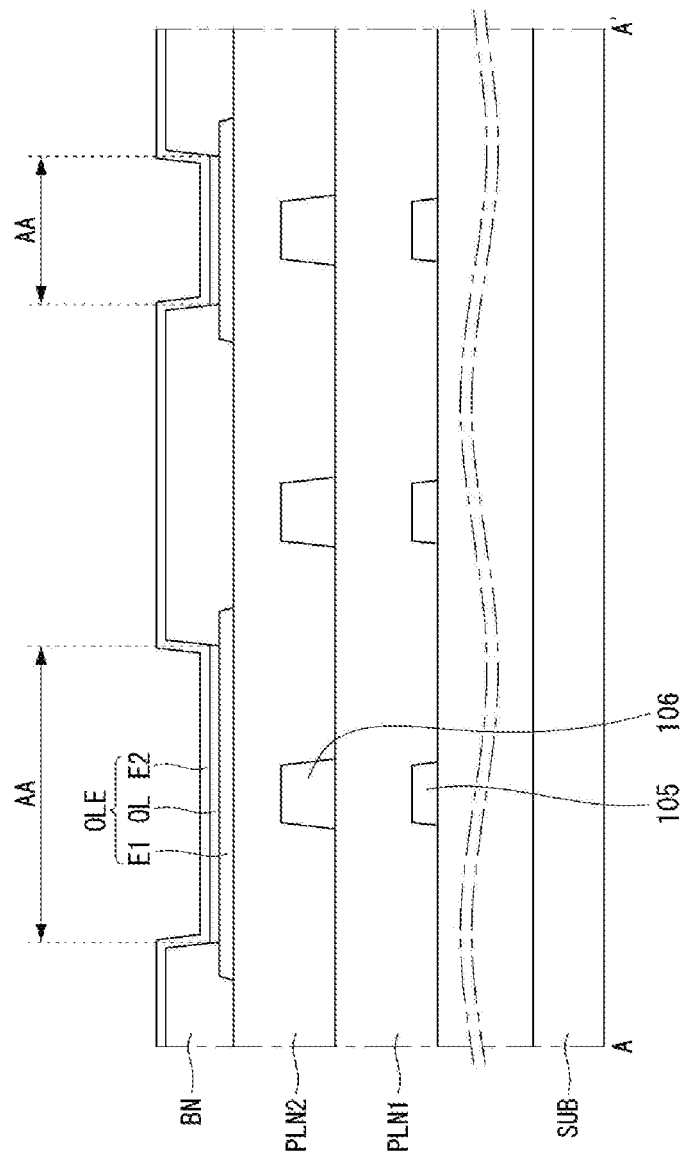
FIG. 22 is a cross-sectional view taken on line A-A' in FIG. 21 according to an embodiment of the present disclosure.
Figure 23A:
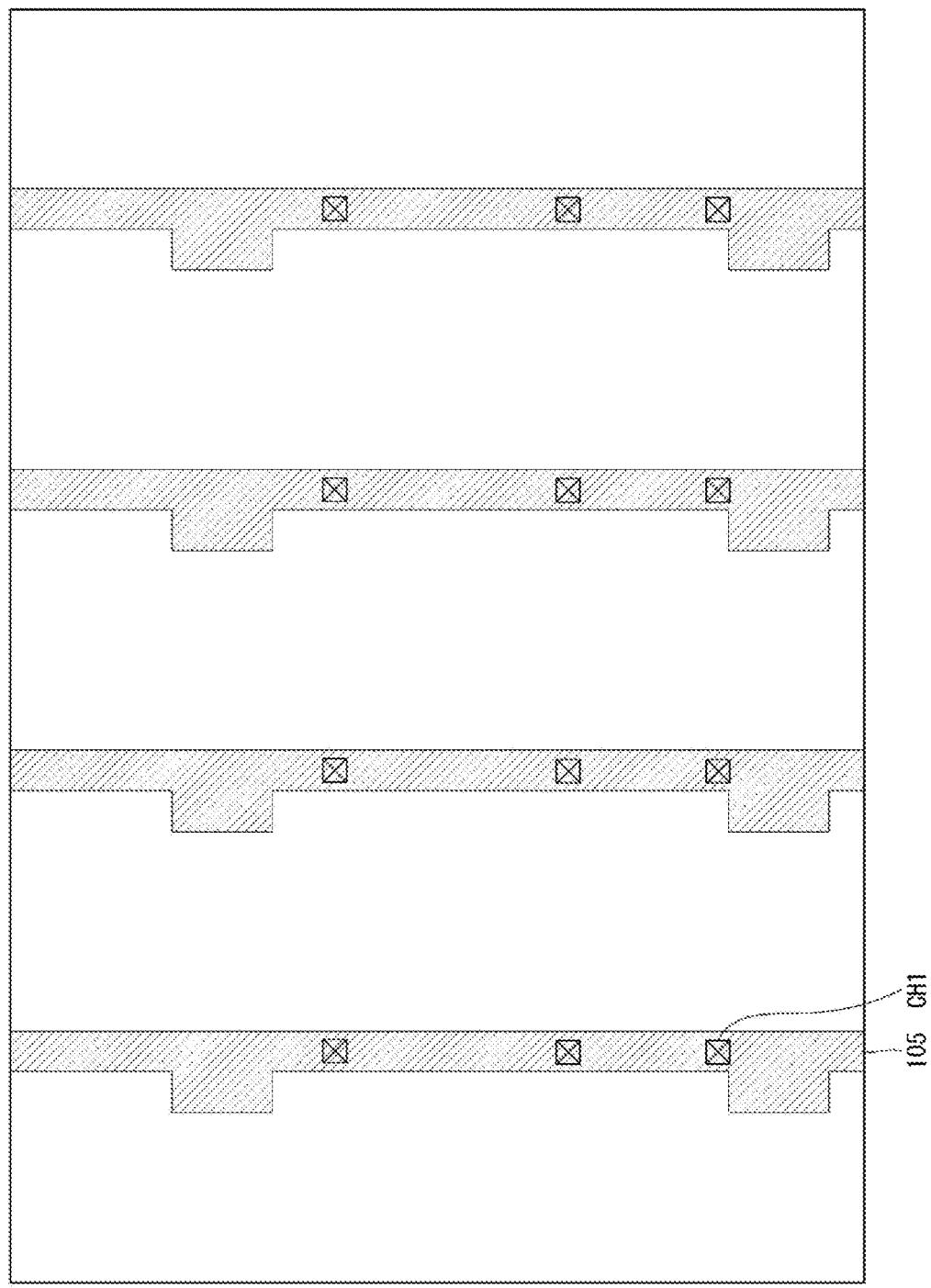
FIGS. 23A to 23C are diagrams showing layers constituting a pixel circuit in a layered manner according to an embodiment of the present disclosure.
Figure 23B:
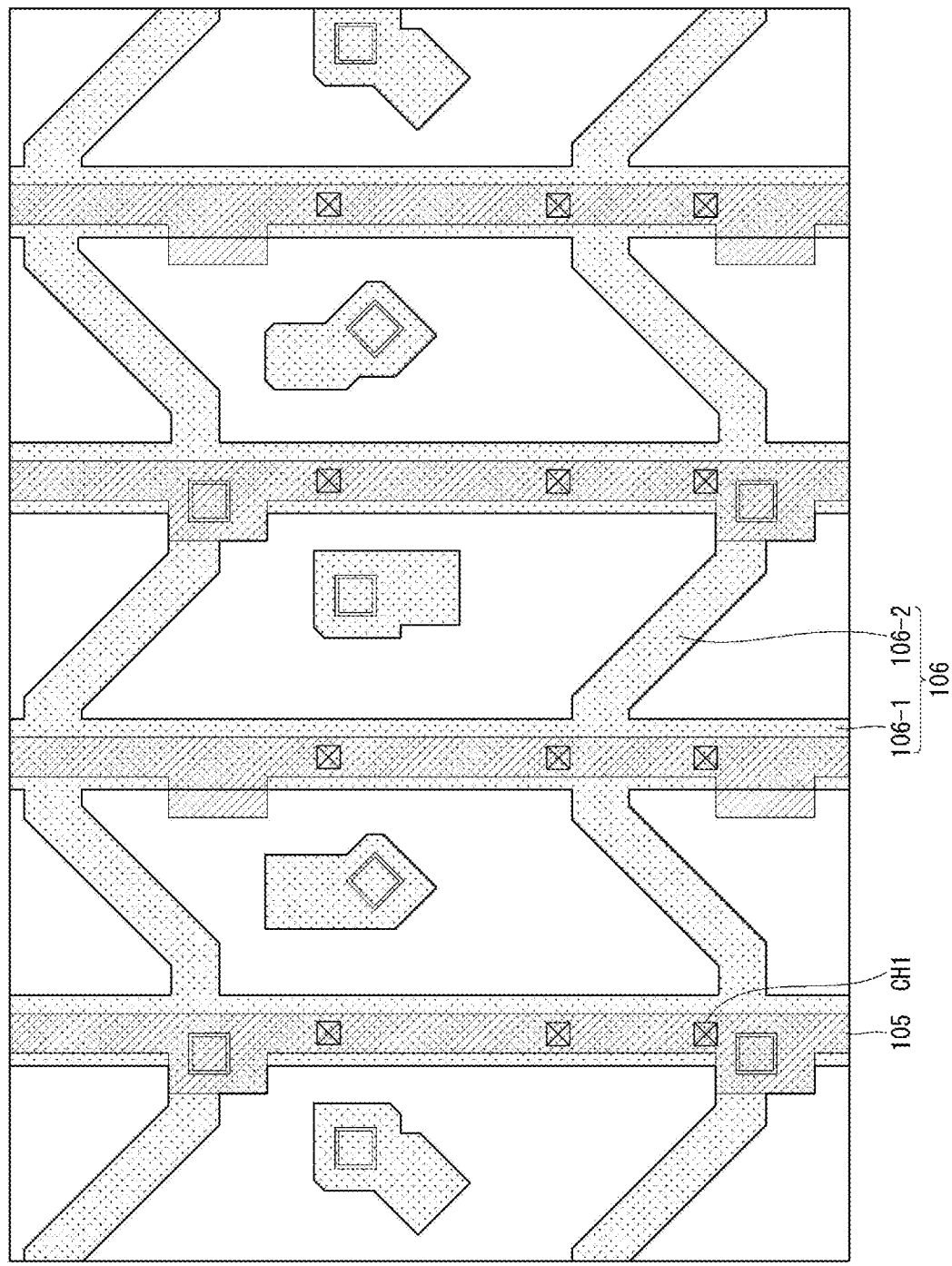
Figure 23C:
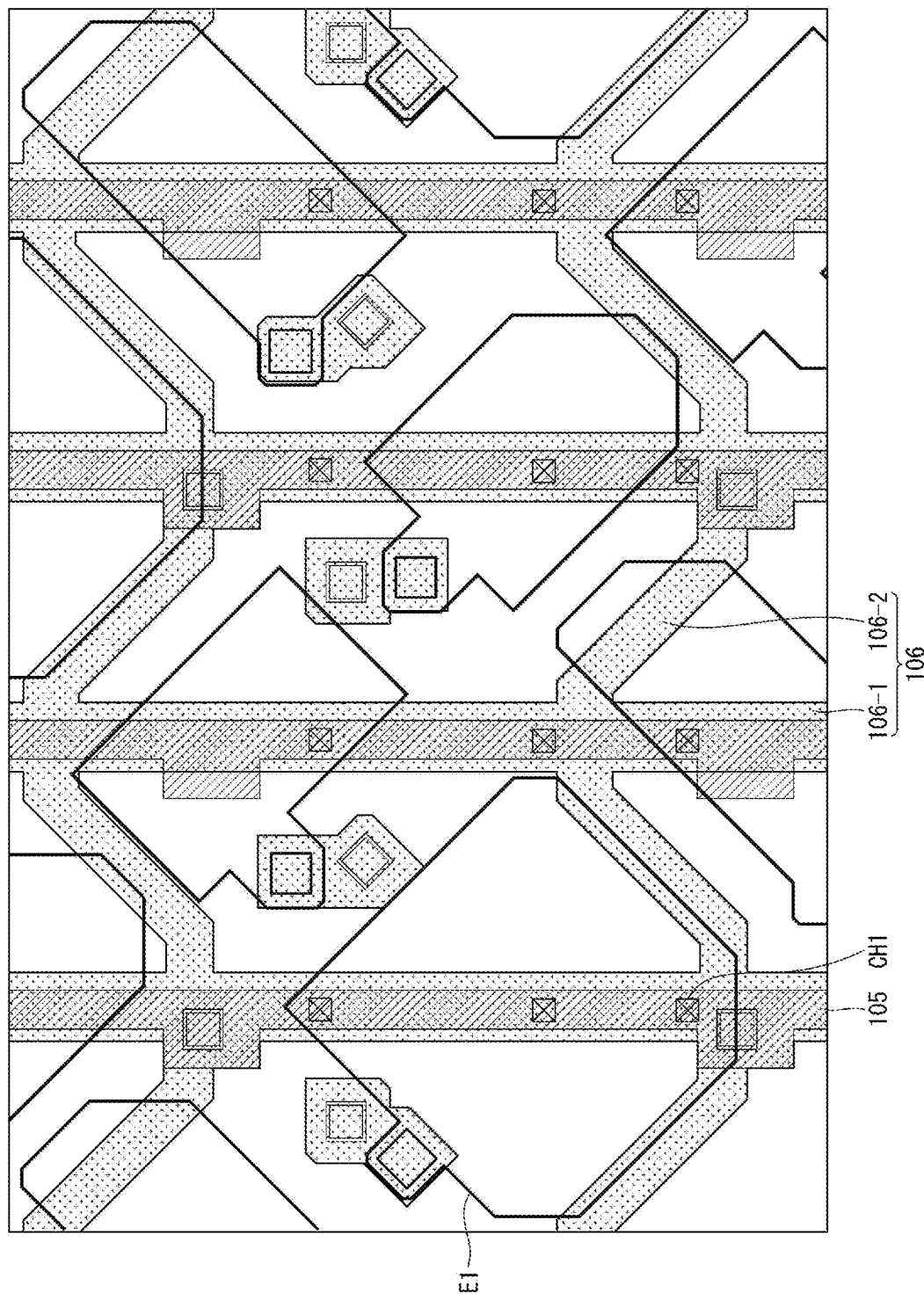

FIG. 21 is a diagram illustrating a configuration example of a pixel circuit in an electroluminescent display according to a seventh embodiment of the present disclosure. FIG. 22 is a cross-sectional view taken on line A-A' in FIG. 21. FIGS. 23A to 23C are diagrams showing layers constituting a pixel circuit in a layered manner.

Referring to FIGS. 21 and 22, an electroluminescent display according to a seventh embodiment of the present disclosure includes a display panel having sub-pixels and wirings to which a signal (or a power supply voltage) for driving the sub-pixels is applied.

Each of the sub-pixels includes a transistor disposed on a substrate SUB and an organic light emitting diode OLE connected to the transistor. The organic light emitting diode OLE includes an anode E1 connected to the transistor, a cathode E2 disposed opposite the anode E1, and an organic light emitting layer OL interposed between the anode E1 and the cathode E2. A light emitting area AA may be defined on the anode E1. A planar shape of the light emitting area AA has a center of gravity corresponding to the shape.

The wirings include a VDD wiring 105 for supplying a high level power supply voltage to the sub-pixels and a first auxiliary wiring 106 electrically connected to the VDD wiring 105 for lowering resistance of the VDD wiring 105. The VDD wiring 105 may be electrically connected with the first auxiliary wiring 106 through a contact hole CH1 passing through an insulating layer formed between the VDD wiring 105 and the first auxiliary wiring 106.

The first auxiliary wiring 106 is a wiring disposed under the anode E1 with a second planarization layer PLN2 interposed therebetween. Therefore, the first auxiliary wiring 106 may be arranged in the same manner as the first wiring LN1 described in the first embodiment. The first auxiliary wiring 106 may include a 1-1 auxiliary wiring and a 1-2 auxiliary wiring, and the 1-1 auxiliary wiring and the 1-2 auxiliary wiring may be arranged in the same manner as the 1-1 wiring LN1-1 and the 1-2 wiring LN1-2 described in the second embodiment. The first auxiliary wiring 106 may be arranged in the same manner as the bypass wiring DLN described in the sixth embodiment.

For example, as shown in the figure, the first auxiliary wiring 106 may be divided into a first portion 106-1 and a second portion 106-2. The first portion 106-1 may be a portion of the first auxiliary wiring 106 extending in the first axis direction. The second portion 106-2 may be a portion of the first auxiliary wiring 106 extending in the second axis direction.

The first portion 106-1 crosses at least one of the light emitting area AA when viewed from plan. Therefore, an overlapping portion of the first portion 106-1 overlapping with the light emitting area AA has symmetry with respect to the center of gravity of the light emitting area AA. The second portion 106-2 extends while bypassing the light emitting area AA so as not to overlap with the light emitting area AA when viewed from plan. That is, when the second portion 106-2 is difficult to be design symmetrically with respect to the center of gravity of the light emitting area AA, the second portion 106-2 is formed to bypass the light emitting area AA.

The VDD wiring 105 is disposed under the first auxiliary wiring 106 with a first planarization layer PLN1 interposed therebetween. Therefore, as described in the fifth embodiment, even if the VDD wiring 105 is not designed symmetrically with respect to the center of gravity of the light emitting area AA, a stepped portion by the VDD wiring 105 can be sufficiently compensated by a laminated structure of the first planarization layer PLN1 and the second planarization layer PLN2. Alternatively, although not shown, the VDD wiring 105 may be disposed so as to bypass the light emitting area AA.

According to the seventh embodiment, the first auxiliary wiring 106 formed under the anode E1 with the second planarization layer PLN2 interposed therebetween may be formed to bypass the light emitting area AA so as not to overlap with the light emitting area AA like the second portion 106-2. Or the first auxiliary wiring 106 formed overlapping with the light emitting area AA like the first portion 106-1 may be disposed symmetrically with respect to the center of gravity CG. However, like the VDD wiring 105, in an instance of a wiring which is formed overlapping with the light emitting area AA but cannot be disposed symmetrically with respect to the center of gravity CG of the light emitting area AA, the first planarization layer PLN1 is further formed under the second planarization layer PLN2, and the VDD wiring 105 is formed under the anode E1 with the first planarization layer PLN1 and the second planarization layer PLN2 interposed therebetween. Therefore, it is possible to sufficiently compensate the stepped portion generated by the wiring disposed asymmetrically with respect to the center of gravity CG of the light emitting area AA. In this way, when the laminated structure of the first planarization layer PLN1 and the second planarization layer PLN2 is used, the stepped portion by the VDD wiring 105 can be sufficiently compensated Thus, referring to FIG. 22, an upper surface of the second planarization layer PLN2 may have a bending by the first auxiliary wiring 106 formed to be adjacent to a lower side of the second planarization layer PLN2. However, by disposing the first auxiliary wiring 106 across the light emitting area AA symmetrically with respect to the center of gravity CG of the light emitting area AA, since the bending of the upper surface of the second planarization layer PLN2 is symmetrically formed, the directionality of the light emitted from the light emitting layer OL can be uniformly dispersed. Therefore, the present disclosure has an advantage that the imbalance of the color viewing angle depending on the position can be minimized.

When viewed from plan, areas of the light emitting area AA corresponding to left and right sides with respect to the first auxiliary wiring 106 overlapping with the light emitting area AA may be substantially the same. Referring to FIG. 22, it can be seen that the left side area of the light emitting area AA and the right side area of the light emitting area AA are substantially the same with respect to the first auxiliary wiring 106.

In the seventh embodiment of the present disclosure, a low-resistance auxiliary wiring connected to the VDD wiring 105 is disposed symmetrically with respect to the center of gravity of the light emitting area AA or disposed so as to bypass the light emitting area AA, so that it is possible to minimize the non-uniformity in luminance due to the voltage drop of the VDD wiring 105 while improving the imbalance of the color viewing angle. Thus, the seventh embodiment of the present disclosure can provide an electroluminescent display in which the display quality is remarkably improved.

Referring to FIGS. 23A to 23C sequentially, layers constituting a pixel circuit will be described.

Referring to FIG. 23A, a first source/drain conductive material is applied on a substrate SUB. The first source/drain conductive material may be one selected from a group consisting of Mo, Al, Cr, Au, Ti, Ni, Nd, and Cu, or a multi-layer thereof.

The first source/drain conductive material is patterned through a mask process to form a VDD wiring 105. The VDD wiring 105 is a wiring to which a high level power supply voltage is applied, and receives the high level power supply voltage from a power generating unit and transmits it to each sub-pixel.

A first planarization layer PLN1 is formed on the substrate SUB on which the VDD wiring 105 is formed. The first planarization layer PLN1 may be formed of an organic material such as photoacryl, polyimide, benzocyclobutene resin and acrylate resin for planarizing a lower stepped portion. A contact hole CH1 exposing a part of the VDD wiring 105 is formed in the first planarization layer PLN1.

Referring to FIG. 23B, a second source/drain conductive material is applied on the substrate SUB on which the first planarization layer is formed. The second source/drain conductive material may be one selected from a group consisting of Mo, Al, Cr, Au, Ti, Ni, Nd, and Cu, or a multi-layer thereof.

The second source/drain conductive material is patterned through a mask process to form a first auxiliary wiring 106. The first auxiliary wiring 106 is electrically connected to the VDD wiring 105 through the contact hole CH1 passing through the first planarization layer PLN1 formed at a lower side. Position of the first auxiliary wiring 106 can be specifically determined in relation to position of an anode E1 (and/or a bank BN) to be formed later.

Position and density of a contact area between the VDD wiring 105 and the first auxiliary wiring 106 can be appropriately selected in consideration of a distance from the power generating unit and a wiring resistance. The VDD wiring 105 may be extended in a direction orthogonal to and/or in parallel with an extending direction of the first auxiliary wiring 106, but is not limited thereto. In order to minimize the non-uniformity in luminance due to the voltage drop of the VDD wiring 105, the first auxiliary wiring 106 is preferably arranged in a mesh shape as shown in the drawings.

A second planarization layer PLN2 is formed on the substrate SUB on which the first auxiliary wiring 106 is formed. The second planarization layer PLN2 may be formed of an organic material such as photoacryl, polyimide, benzocyclobutene resin and acrylate resin. The second planarization layer PLN2 is further disposed on the first planarization layer PLN1, so that the stepped portion by the VDD wiring 105 can be sufficiently compensated.

Referring to FIG. 23C, an anode conductive material is applied on the substrate SUB on which the first auxiliary wiring 106 is formed. The anode conductive material is patterned through a mask process to form an anode E1.

The anode E1 may be a single layer or a multilayer. The anode E1 may function as a reflective electrode including a reflective layer. The reflective layer may be made of aluminum (Al), copper (Cu), silver (Ag), nickel (Ni) or an alloy thereof, preferably APC (silver/palladium/copper alloy).

Referring again to FIG. 21, as described above, the light emitting area AA is defined on the anode E1. A bank BN covering a part of the anode E1 may be formed on the anode E1. In this instance, the light emitting area AA may be defined as a part of the anode E1 exposed by the bank BN.

When the first auxiliary wiring 106 is formed to cross the light emitting area AA, the first auxiliary wiring 106 is formed to be symmetrical with respect to the center of gravity of the light emitting area AA. The first auxiliary wiring 106 is formed so as to bypass the light emitting area AA when it is difficult to form the first auxiliary wiring 106 so as to be symmetrical with respect to the center of gravity of the light emitting area AA.

According to the present disclosure, the wiring across the light emitting area is symmetrically disposed with respect to the center of gravity of the light emitting area, so that the directionality of light depending on the position can be uniformly dispersed. Therefore, the present disclosure has an advantage that the imbalance of the color viewing angle depending on the position can be minimized.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electroluminescent display comprising:
   a display panel including sub-pixels in which a light emitting area is defined, and wirings connected to the sub-pixels, wherein the sub-pixels each have a transistor and a light emitting element,
   wherein the wirings include a first wiring arranged along a first axis direction or a second axis direction perpendicular to the first axis direction,
   wherein the first wiring is disposed under a first electrode of a light emitting element of a given sub-pixel with an organic insulating layer interposed therebetween, and includes an overlapping portion overlapping with a light emitting area of the given sub-pixel when viewed from a plan view, and
   wherein a shape of the overlapping portion of the first wiring has symmetry with respect to a center of gravity of the light emitting area of the given sub-pixel.

2. The electroluminescent display of claim 1, wherein the shape of the overlapping portion of the first wiring has line symmetry with respect to a first axis of symmetry or a second axis of symmetry,
   wherein the first axis of symmetry is parallel with the first axis direction and passes through the center of gravity of the light emitting area of the given sub-pixel, and
   wherein the second axis of symmetry is parallel with the second axis direction and passes through the center of gravity of the light emitting area of the given sub-pixel.

3. The electroluminescent display of claim 1, wherein the shape of the overlapping portion of the first wiring has point symmetry with respect to a center of symmetry that is the center of gravity of the light emitting area of the given sub-pixel.

4. The electroluminescent display of claim 1, wherein the wirings comprise a second wiring disposed under the first wiring with an inorganic insulating layer interposed therebetween, and arranged along the first axis direction or the second axis direction,
   wherein the second wiring includes an overlapping portion overlapping with the light emitting area of the given sub-pixel when viewed from the plan view,
   wherein the overlapping portion of the second wiring has:
   a shape with line symmetry with respect to a first axis of symmetry, a shape with line symmetry with respect to a second axis of symmetry or a shape with point symmetry with respect to a center of symmetry,
wherein the first axis of symmetry is parallel with the first axis direction and passes through the center of gravity of the light emitting area of the given sub-pixel,
wherein the second axis of symmetry is parallel with the second axis direction and passes through the center of gravity of the light emitting area of the given sub-pixel, and
wherein the center of symmetry is the center of gravity of the light emitting area of the given sub-pixel.

5. The electroluminescent display of claim 1, wherein the wirings comprise:
a 2-1 wiring disposed under the first wiring with an inorganic insulating layer interposed therebetween, and arranged along the first axis direction or the second axis direction, and
a 2-2 wiring disposed under the first wiring with the inorganic insulating layer interposed therebetween and arranged in parallel with the 2-1 wiring,
wherein the 2-1 wiring and the 2-2 wiring include an overlapping portion overlapping with the light emitting area of the given sub-pixel when viewed from the plan view,
wherein a shape of the overlapping portion of the 2-1 wiring and a shape of the overlapping portion of the 2-2 wiring have line symmetry with respect to an axis of symmetry or point symmetry with respect to a center of symmetry,
wherein the axis of symmetry is parallel with an extending direction of the 2-1 wiring and passes through the center of gravity of the light emitting area of the given sub-pixel, and
wherein the center of symmetry is the center of gravity of the light emitting area of the given sub-pixel.

6. The electroluminescent display of claim 1, wherein the display panel further comprises an organic insulating layer disposed under the first wiring.

7. The electroluminescent display of claim 1, wherein the wirings comprise a bypass wiring disposed in the same layer as the first wiring, and
wherein the bypass wiring does not overlap with the light emitting area of the given sub-pixel when viewed from the plan view.

8. The electroluminescent display of claim 1, wherein the wirings comprise:
a VDD wiring for supplying a high level power supply voltage to the sub-pixels, and
a first auxiliary wiring disposed on the VDD wiring with an organic insulating layer interposed therebetween and extending in at least one of the first axis direction and the second axis direction,
wherein the first auxiliary wiring is the first wiring.

9. An electroluminescent display comprising:
a display panel including sub-pixels in which a light emitting area of each sub-pixel is defined and wirings connected to the sub-pixels, wherein each of the sub-pixels have a transistor and a light emitting element,
wherein the wirings include:
a 1-1 wiring arranged along a first axis direction or a second axis direction perpendicular to the first axis direction, and
a 1-2 wiring arranged in parallel with the 1-1 wiring,
wherein the 1-1 wiring and the 1-2 wiring are disposed under a first electrode of a light emitting element of a given sub-pixel with an organic insulating layer interposed therebetween, and include an overlapping portion overlapping with a light emitting area when viewed from a plan view, and
wherein a shape of the overlapping portion of the 1-1 wiring and a shape of the overlapping portion of the 1-2 wiring are symmetrical with respect to a center of gravity of the light emitting area of the sub-pixel.

10. The electroluminescent display of claim 9, wherein the shape of the overlapping portion of the 1-1 wiring and the shape of the overlapping portion of the 1-2 wiring have line symmetry with respect to an axis of symmetry that is parallel with an extending direction of the 1-1 wiring and passes through the center of gravity of the light emitting area of the given sub-pixel.

11. The electroluminescent display of claim 9, wherein the shape of the overlapping portion of the 1-1 wiring and the shape of the overlapping portion of the 1-2 wiring have point symmetry with respect to the center of gravity of the light emitting area of the given sub-pixel as a center of symmetry.

12. The electroluminescent display of claim 9, wherein the wirings further comprise:
a second wiring disposed under the 1-1 wiring with an inorganic insulating layer interposed therebetween, and arranged along the first axis direction or the second axis direction,
wherein the second wiring includes an overlapping portion overlapping with the light emitting area when viewed from the plan view,
wherein a shape of the overlapping portion of the second wiring has:
line symmetry with respect to a first axis of symmetry, line symmetry with respect to a second axis of symmetry or point symmetry with respect to a center of symmetry,
wherein the first axis symmetry is parallel with the first axis direction and passes through the center of gravity of the light emitting area of the given sub-pixel,
wherein the second axis of symmetry is parallel with the second axis direction and passes through the center of gravity of the light emitting area of the given sub-pixel, and
wherein the center of symmetry is the center of gravity of the light emitting area of the given sub-pixel.

13. The electroluminescent display of claim 9, wherein the wirings further comprise:
a 2-1 wiring disposed under the 1-1 wiring and the 1-2 wiring with an inorganic insulating layer interposed therebetween, and arranged along the first axis direction or the second axis direction, and
a 2-2 wiring disposed under the 1-1 wiring and the 1-2 wiring with an inorganic insulating layer interposed therebetween, and arranged in parallel with the 2-1 wiring,
wherein the 2-1 wiring and the 2-2 wiring include an overlapping portion overlapping with the light emitting area of the given sub-pixel when viewed from the plan view, and
wherein a shape of the overlapping portion of the 2-1 wiring and a shape of the overlapping portion of the 2-2 wiring have:
line symmetry with respect to an axis of symmetry that is parallel with an extending direction of the 2-1 wiring and passes through the center of gravity of the light emitting area of the given sub-pixel, or
point symmetry with respect to the center of gravity of the light emitting area of the given sub-pixel as a center of symmetry.

14. The electroluminescent display of claim 9, wherein the display panel further comprises an organic insulating layer disposed under the 1-1 wiring and the 1-2 wiring.

15. The electroluminescent display of claim 9, wherein the wirings further comprise a bypass wiring disposed in the same layer as the 1-1 wiring and the 1-2 wiring, and
wherein the bypass wiring does not overlap with the light emitting area of the given sub-pixel when viewed from a plan view.

16. The electroluminescent display of claim 9, wherein the wirings further comprise:
a VDD wiring for supplying a high level power supply voltage to the sub-pixels, and
a first auxiliary wiring disposed on the VDD wiring with an organic insulating layer interposed therebetween and extending in at least one of the first axis direction and the second axis direction,
wherein the first auxiliary wiring is the 1-1 wiring and the 1-2 wiring.

* * * * *